United States Patent
Lius et al.

(10) Patent No.: US 12,439,782 B2
(45) Date of Patent: Oct. 7, 2025

(54) DISPLAY PANEL

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 650 days.

(21) Appl. No.: 17/736,150

(22) Filed: May 4, 2022

(65) Prior Publication Data
US 2022/0399430 A1    Dec. 15, 2022

(30) Foreign Application Priority Data
Jun. 11, 2021   (CN) .......................... 202110655845.4

(51) Int. Cl.
*H10K 59/131*    (2023.01)
*H10D 30/67*     (2025.01)
*H10K 59/121*    (2023.01)

(52) U.S. Cl.
CPC ....... *H10K 59/131* (2023.02); *H10D 30/6743* (2025.01); *H10D 30/6755* (2025.01); *H10K 59/1213* (2023.02)

(58) Field of Classification Search
CPC . G09G 3/3233; H10K 59/131; H10K 59/1213
USPC .......................................................... 257/59
See application file for complete search history.

(56) References Cited

U.S. PATENT DOCUMENTS

| | | | |
|---|---|---|---|
| 7,839,364 B2 | 11/2010 | Ahn | |
| 8,576,367 B2 | 11/2013 | Yoo | |
| 8,830,145 B2 | 9/2014 | Okuno | |
| 11,545,539 B2 | 1/2023 | Jo | |

(Continued)

FOREIGN PATENT DOCUMENTS

| | | |
|---|---|---|
| CN | 111029366 A | 4/2020 |
| CN | 112117308 A | 12/2020 |
| WO | 2021/077332 A1 | 4/2021 |

OTHER PUBLICATIONS

Chinese language office action dated Oct. 5, 2022, issued in application No. TW 111111005.
(Continued)

*Primary Examiner* — Ratisha Mehta
*Assistant Examiner* — Mikka Liu
(74) *Attorney, Agent, or Firm* — McClure, Qualey & Rodack, LLP

(57) ABSTRACT

A display panel includes a substrate and a pixel circuit. The pixel circuit is disposed on the substrate. The pixel circuit is configured to drive a light-emitting unit. The pixel circuit includes a first conductive line, a second conductive line disposed adjacent the first conductive line, a third conductive line and a fourth conductive line. The first conductive line and the second conductive line are disposed between the third conductive line and the fourth conductive line. The first conductive line, the second conductive line, the third conductive line, and the fourth conductive line extend along the same direction. The first distance Y1 between the first conductive line and the second conductive line and the second distance Y2 between the third conductive line and the fourth conductive line conform to the following relationship: $0 \leq Y1/Y2 \leq 0.25$.

19 Claims, 17 Drawing Sheets

(56) References Cited

U.S. PATENT DOCUMENTS

| | | |
|---|---|---|
| 11,895,885 B2 | 2/2024 | Kang |
| 2013/0201085 A1 | 8/2013 | Chang et al. |
| 2018/0284927 A1* | 10/2018 | Kim ..................... H10K 59/126 |
| 2019/0250764 A1* | 8/2019 | Kim ....................... H10K 59/12 |
| 2021/0200366 A1* | 7/2021 | Bok ....................... G06V 10/17 |
| 2022/0005909 A1 | 1/2022 | Du et al. |

OTHER PUBLICATIONS

Chinese language office action dated May 15, 2024, issued in application No. CN 202110655845.4.
Office Action dated Jan. 28, 2025, issued in application No. PH 1/2022/050263.
Lin, C.L., et al.; "A new a-IGZO AMOLED pixel circuit design to improve the OLED luminance degradation in 3D displays;" SID 2013 Digest; pp. 1107-1109.

* cited by examiner

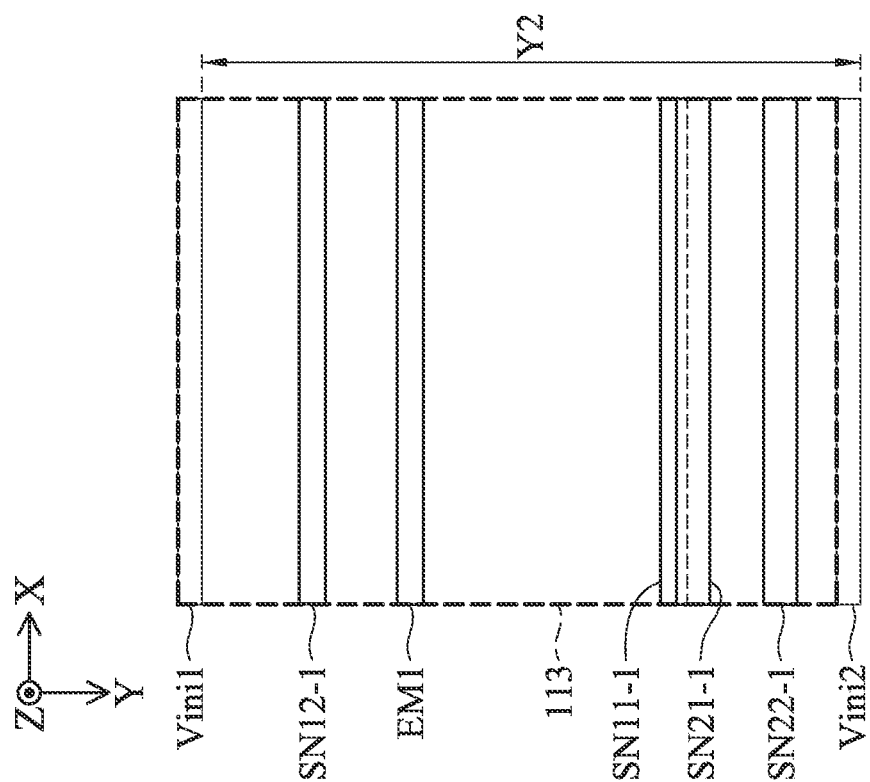
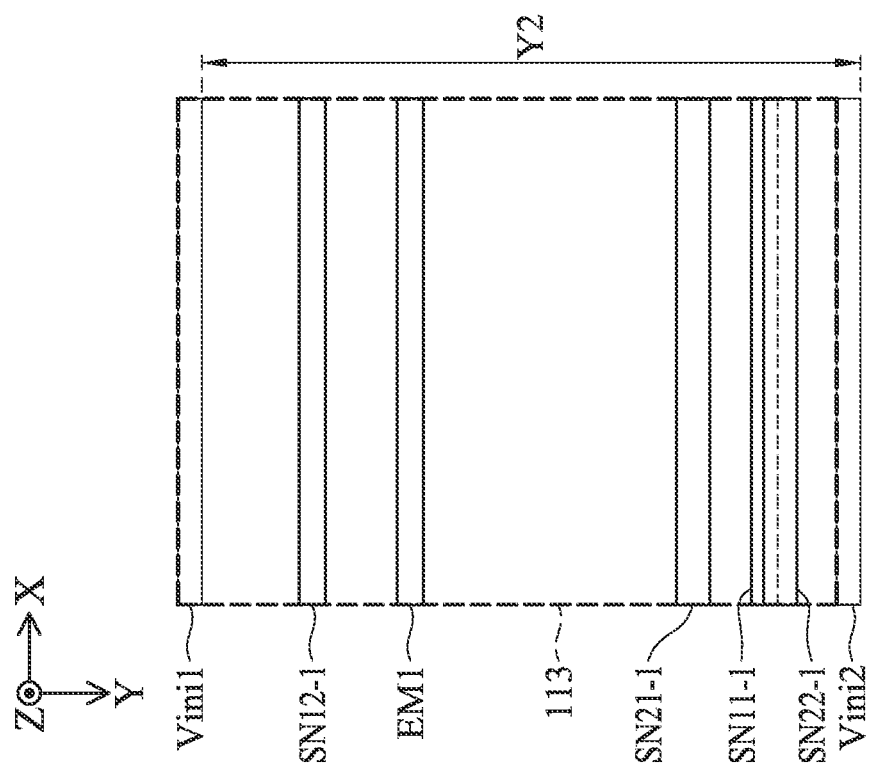

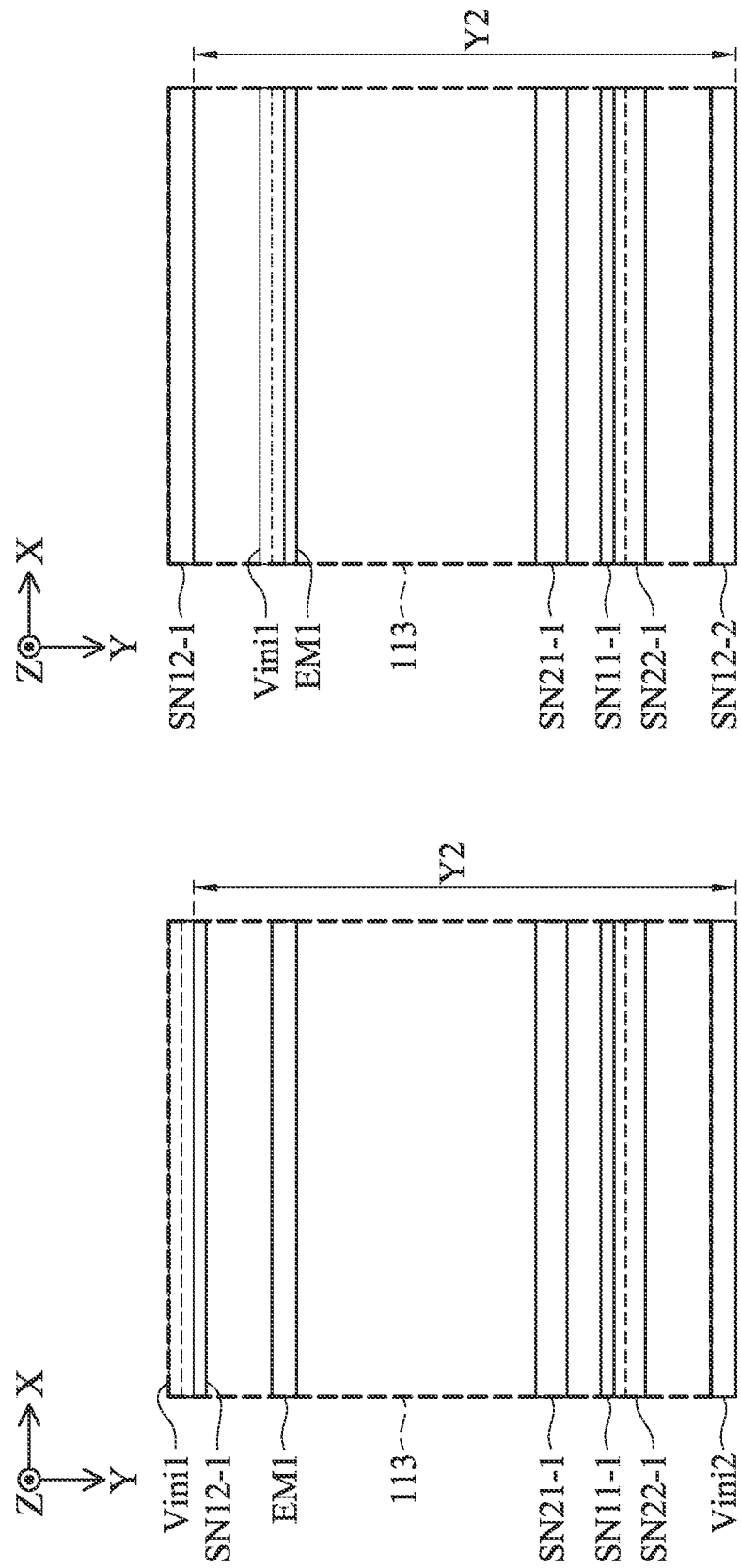

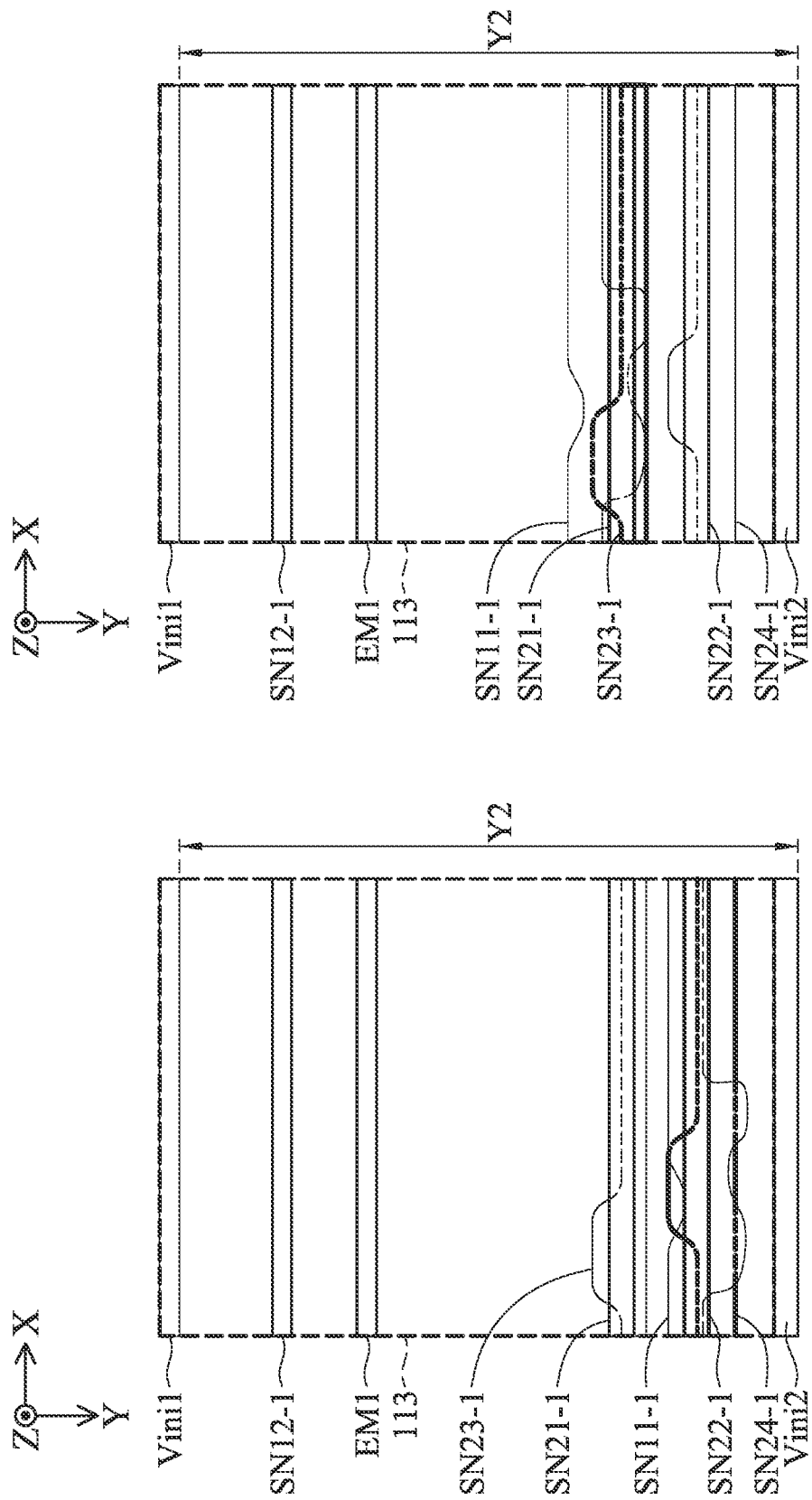

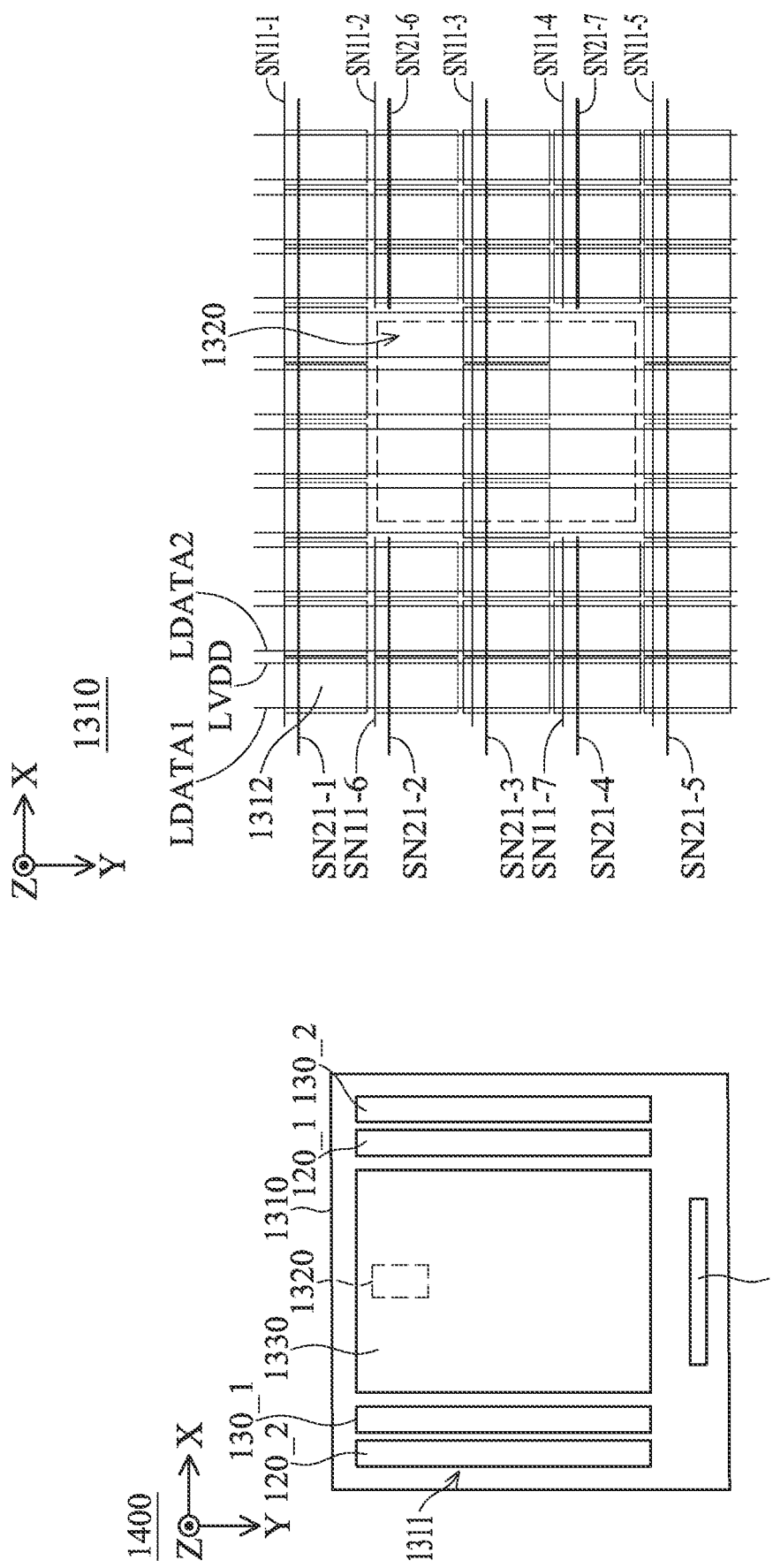

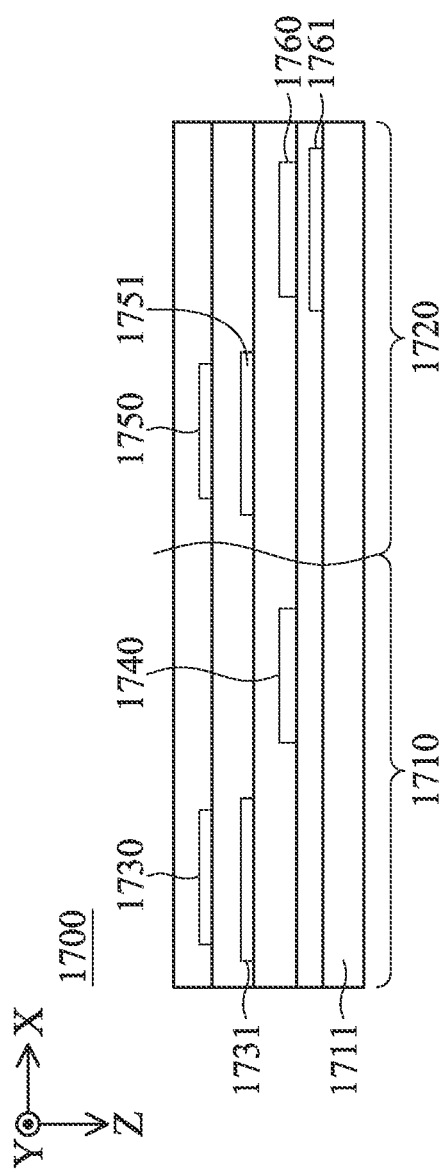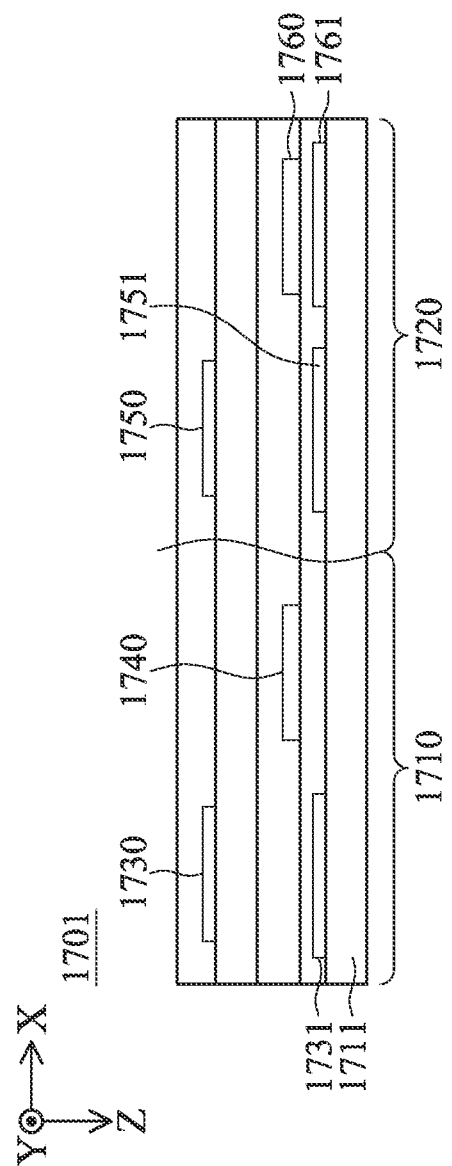

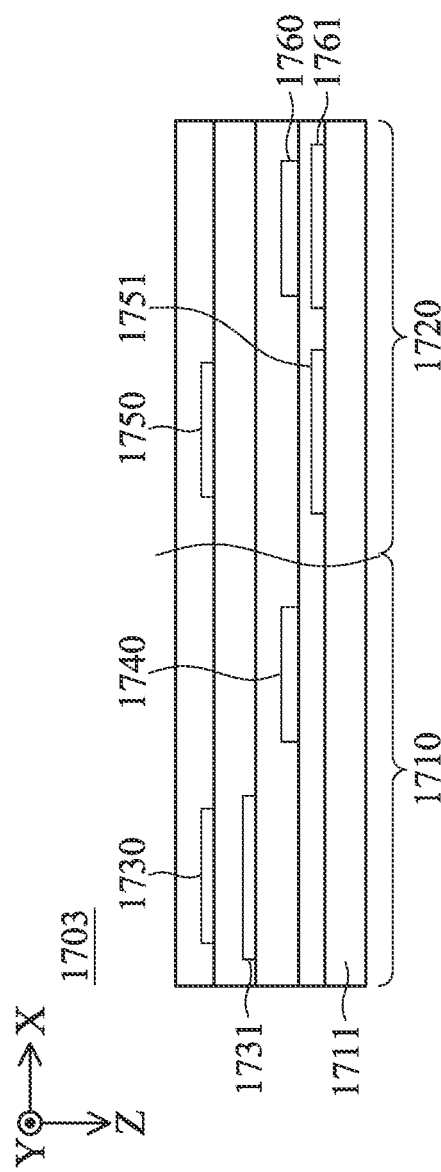
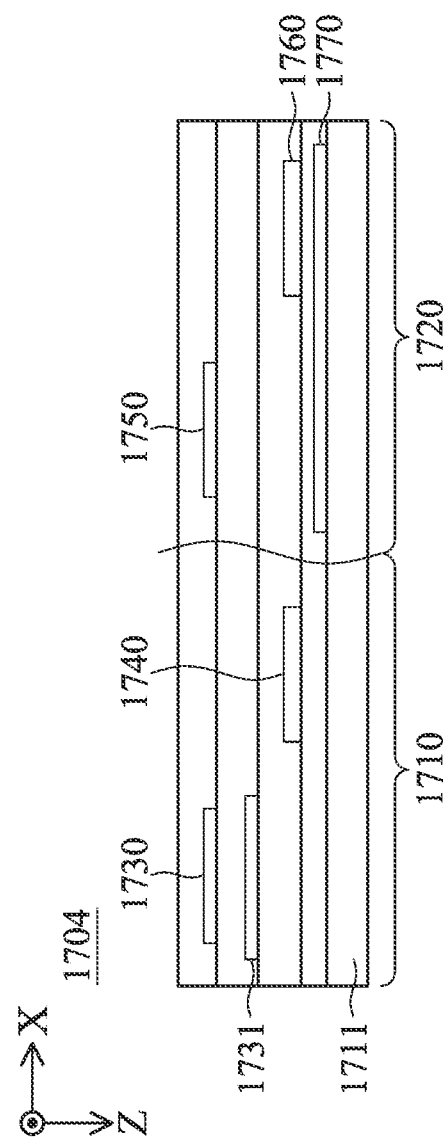
FIG. 17C
FIG. 17D

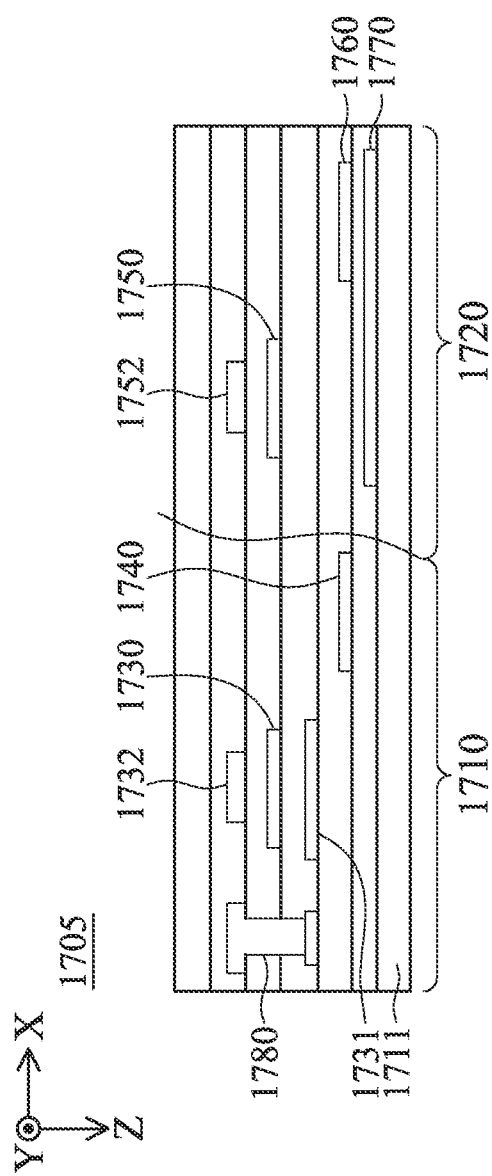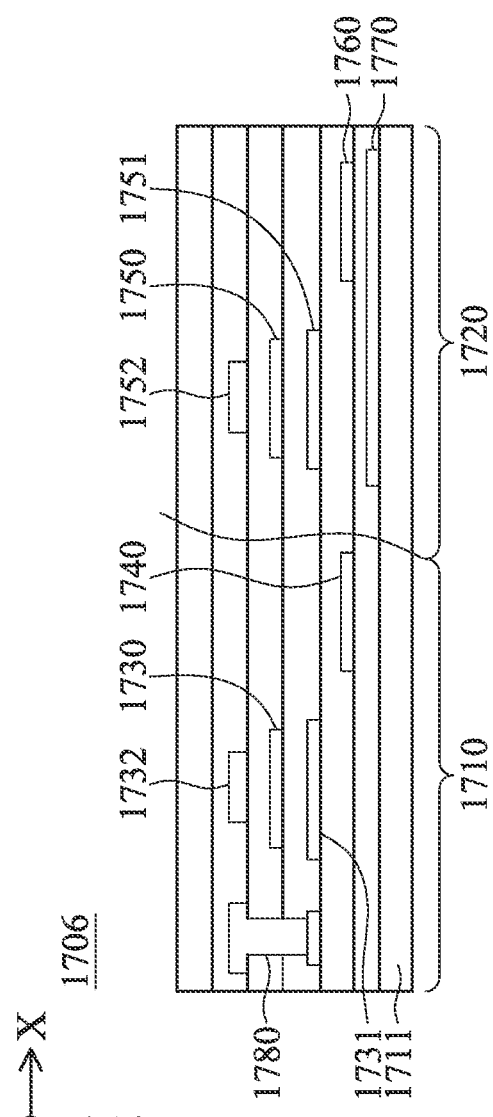

DISPLAY PANEL

CROSS REFERENCE TO RELATED APPLICATIONS

This application claims priority of China Patent Application No. 202110655845.4, filed on Jun. 11, 2021, the entirety of which is incorporated by reference herein.

BACKGROUND OF THE DISCLOSURE

Field of the Disclosure

The present disclosure relates to a display panel, and in particular it relates to an display panel with conductive lines that have different distances.

Description of the Related Art

A display panel of a conventional electronic device uses a plurality of signal lines to drive a light-emitting element, so as to generate a light corresponding to the brightness. However, when the electronic device uses more signal lines, it will occupy more space and cause the pixels of the display panel to become larger, so that the resolution of the display panel may be decreased, and the display quality of the electronic device may be decreased accordingly. Therefore, a new display panel that changes the arrangement of the signal lines to improve the resolution of the display panel is needed to solve the above problem.

BRIEF SUMMARY OF THE DISCLOSURE

An embodiment of the disclosure provides a display panel, which includes a substrate and a pixel circuit. The pixel circuit is disposed on the substrate, wherein the pixel circuit is configured to drive a light-emitting unit and the pixel circuit includes a first conductive line, a second conductive line disposed adjacent the first conductive line, a third conductive line and a fourth conductive line. The first conductive line and the second conductive line are disposed between the third conductive line and the fourth conductive line. The first conductive line, the second conductive line, the third conductive line, and the fourth conductive line extend along the same direction. The first distance Y1 between the first conductive line and the second conductive line and the second distance Y2 between the third conductive line and the fourth conductive line conform to the following relationship: $0 \leq Y1/Y2 \leq 0.25$.

An embodiment of the disclosure provides a display panel, which includes a substrate, a first conductive line and a second conductive line. The substrate has a sensing region and a non-sensing region adjacent to the sensing region. The first conductive line and the second conductive line are disposed on the substrate and extend along the same direction. The second conductive line is disposed adjacent to the first conductive line. The first distance between the first conductive line and the second conductive line on the sensing region is different from the second distance between the first conductive line and the second conductive line on the non-sensing region.

BRIEF DESCRIPTION OF THE DRAWINGS

The disclosure can be fully understood by reading the subsequent detailed description and examples with references made to the accompanying drawings, wherein:

FIG. 8A is a schematic view of an arrangement of conductive lines of a pixel circuit of an electronic device according to another embodiment of the disclosure;

FIG. 8B is a schematic view of an arrangement of conductive lines of a pixel circuit of an electronic device according to another embodiment of the disclosure;

FIG. 10A is a schematic view of an arrangement of conductive lines of a pixel circuit of an electronic device according to another embodiment of the disclosure;

FIG. 10B is a schematic view of an arrangement of conductive lines of a pixel circuit of an electronic device according to another embodiment of the disclosure;

FIG. 12A is a schematic view of an arrangement of conductive lines of a pixel circuit of an electronic device according to another embodiment of the disclosure;

FIG. 12B is a schematic view of an arrangement of conductive lines of a pixel circuit of an electronic device according to another embodiment of the disclosure;

FIG. 14A is a schematic view of an electronic device according to another embodiment of the disclosure;

FIG. 14B is a schematic view of a display panel according to an embodiment of the disclosure;

FIG. 17A is a cross-sectional view of semiconductor layers and the light shielding layers in a sensing region and a non-sensing region of a display panel according to an embodiment of the disclosure;

FIG. 17B is a cross-sectional view of semiconductor layers and the light shielding layers in a sensing region and a non-sensing region of a display panel according to another embodiment of the disclosure;

FIG. 17C is a cross-sectional view of semiconductor layers and the light shielding layers in a sensing region and a non-sensing region of a display panel according to another embodiment of the disclosure;

FIG. 17D is a cross-sectional view of semiconductor layers and the light shielding layers in a sensing region and a non-sensing region of a display panel according to another embodiment of the disclosure;

FIG. 17E is a cross-sectional view of semiconductor layers and the light shielding layers in a sensing region and a non-sensing region of a display panel according to another embodiment of the disclosure; and FIG. 17F is a cross-sectional view of semiconductor layers and the light shielding layers in a sensing region and a non-sensing region of a display panel according to another embodiment of the disclosure.

DETAILED DESCRIPTION OF THE DISCLOSURE

Figures 1, 2:
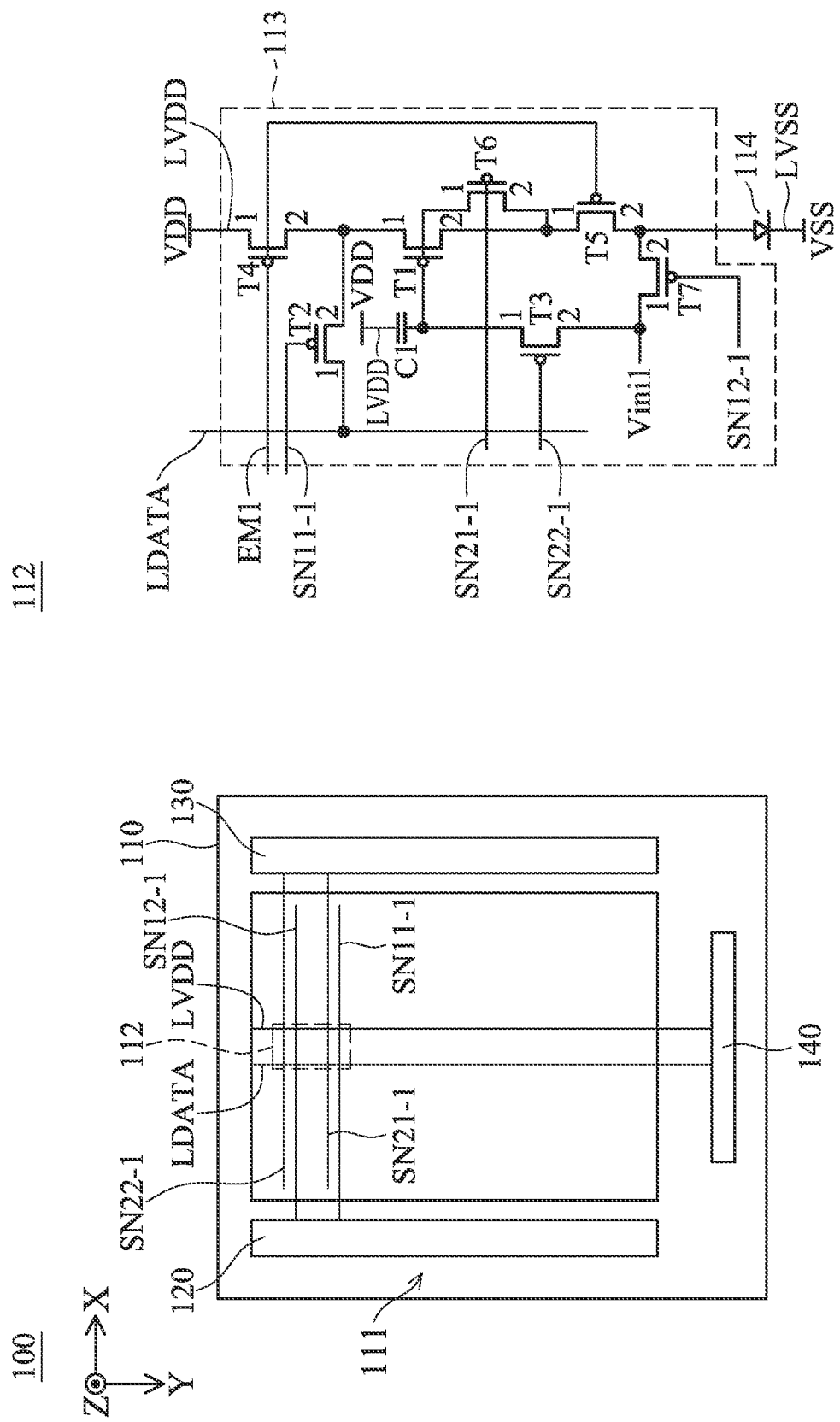
FIG. 1 is a schematic view of an electronic device according to an embodiment of the disclosure.
FIG. 2 is a schematic view of a circuit of a pixel of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

In the disclosure, the technical features of the various embodiments may be replaced or combined with each other to complete other embodiments without being mutually exclusive.

The "including" or "comprising" mentioned in the entire specification and claims is an open term, so it should be interpreted as "including or comprising but not limited to".

Furthermore, "connected" or "coupled" herein includes any direct and indirect connection means. Therefore, an element or layer is referred to as being "connected to" or "coupled to" another element or layer, the element or layer can be directly on, connected or coupled to another element or layer or intervening elements or layers may be present. When an element is referred to as being "directly connected to" or "directly coupled to" another element or layer, there are no intervening elements or layers present. If the text describes that a first device on a circuit is coupled to a second device, it indicates that the first device may be directly electrically connected to the second device. When the first device is directly electrically connected to the second device, the first device and the second device are only connected through conductive lines or passive elements (such as resistors, capacitors, etc.), and no other electronic elements are connected between the first device and the second device.

The directional term mentioned in the text, such as "upper", "lower", "front", "rear", "left", "right", etc., is only direction with reference to the drawings. Therefore, the used directional term is used to illustrate, but not to limit the disclosure. In the drawings, each drawing shows the general characteristics of the method, structure and/or material used in a specific embodiment. However, these drawings should not be construed as defining or limiting the scope or nature covered by these embodiments. For example, for the sake of clarity, the relative size, thickness and position of each layer, region and/or structure may be reduced or enlarged.

It will be understood that when an element or layer is referred to as being "on" another element or layer, the element or layer can be directly on another element or layer or intervening elements or layers may be present. In contrast, when an element is referred to as being "directly on" another element or layer, there are no intervening elements or layers present. The terms of bonding and connecting may also include the case where two structures are moveable or two structures are fixed.

In the disclosure, the thickness, the length and the width may be measured by using an optical microscope (OM), and the thickness and the length may be measured from a section image in a scanning electron microscope (SEM), but the disclosure is not limited thereto. In addition, there may be a certain error in any two values or directions used for comparison.

It should be understood that although the terms such as "first", "second", etc., may be used herein to describe various elements, components, regions, layers and/or parts, these elements, components, regions, layers and/or parts should not be limited by these terms. These terms are only used to distinguish one element, component, region, layer and/or part from another element, component, region, layer and/or part. Therefore, without departing from the teaching of the disclosure, a first element, a first component, a first region, a first layer or a first part discussed below may also be referred to as a second element, a second component, a second region, a second layer or a second part.

Furthermore, phrases such as "within a range of a first value and a second value" or "in a range between a first value and a second value" indicate that the range includes the first value, the second value and other values between the first value and the second value.

The terms "about", "equal to", "equal" or "the same", or "substantially" or "approximately" usually represent within 20% of a given value or range, or represent within 10%, 5%, 3%, 2%, 1% or 0.5% of the given value or range.

In an embodiment, the electronic device may include a display device, a backlight device, an antenna device, a sensing device or a splicing device, but the disclosure is not limited thereto. The electronic device may be a bendable or flexible electronic device. The display device may be a non-self-luminous type display device or a self-luminous type display device. The antenna device may be a liquid-crystal type antenna device or a non-liquid-crystal type antenna device, and the sensing device may be a sensing device that senses capacitance, light, heat or ultrasound, but the disclosure is not limited thereto. The electronic component may include a passive component and an active component, such as a capacitor, a resistor, an inductor, a diode, a transistor, etc. The diode may include a light-emitting diode or a photodiode. The light-emitting diode may include, for example, an organic light emitting diode (OLED), a mini LED, a micro LED or a quantum dot LED, but the disclosure is not limited thereto. The splicing device may be, for example, a display splicing device or an antenna splicing device, but the disclosure is not limited thereto. It should be noted that the electronic device may be any arrangement and combination of the above devices, but the disclosure is not limited thereto. Hereinafter, the display device will be used as an electronic device or a splicing device to illustrate to the content of the disclosure, but the disclosure is not limited thereto.

Figure 3:
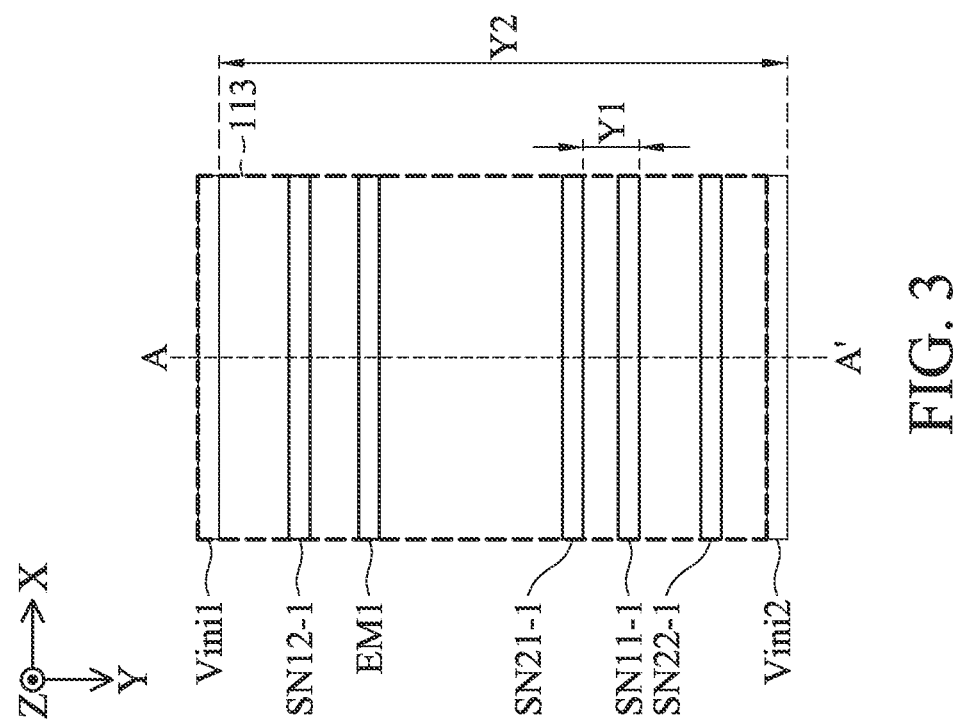
FIG. 3 is a schematic view of an arrangement of conductive lines of a pixel circuit of an electronic device according to an embodiment of the disclosure.
Figure 4:
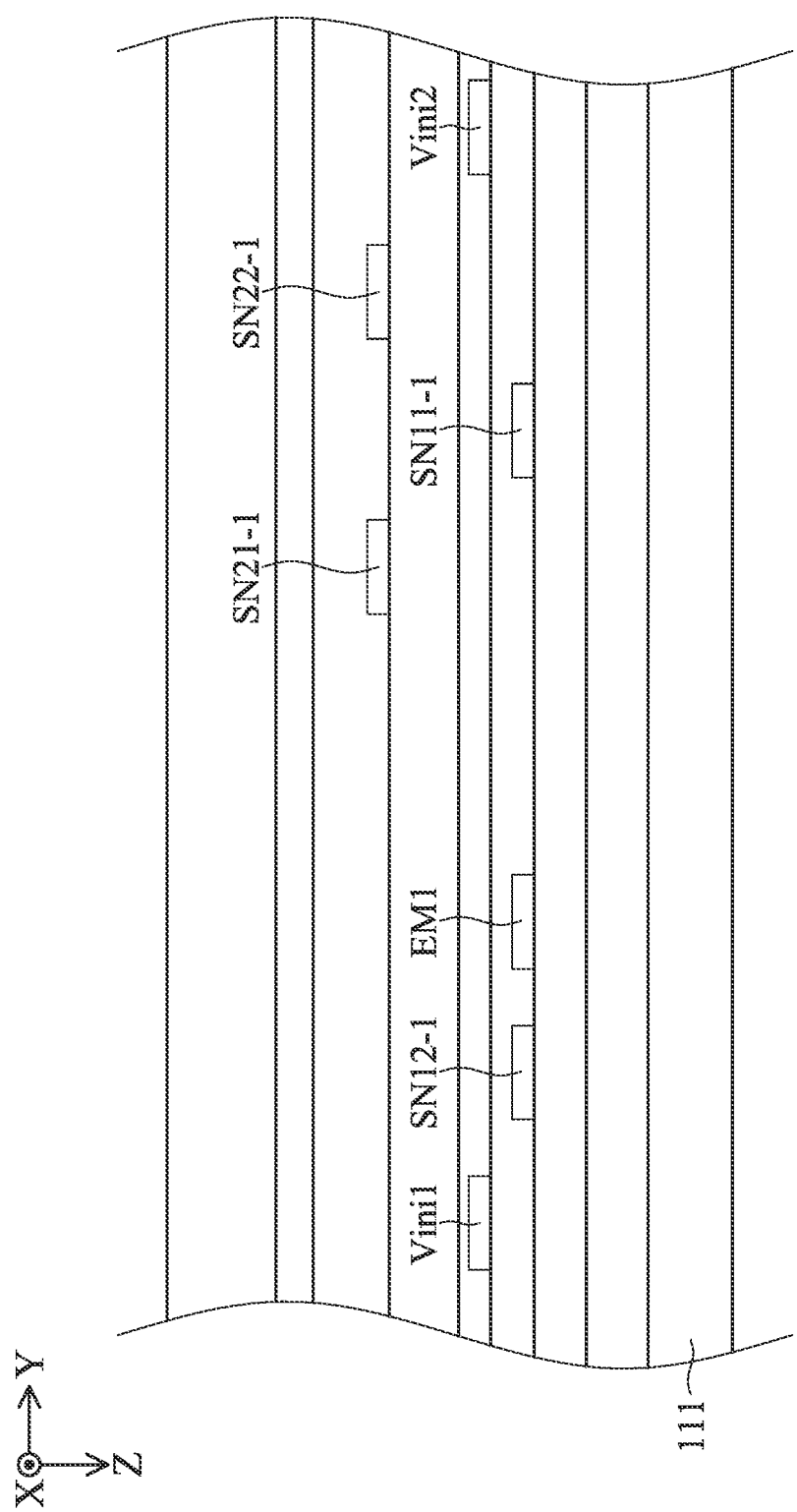
FIG. 4 is a cross-sectional view taken along a line A-A' in FIG. 3.

Please refer to FIG. 1, FIG. 2, FIG. 3 and FIG. 4. FIG. 1 is a schematic view of an electronic device 100 according to an embodiment of the disclosure. FIG. 2 is a schematic view of a circuit of a pixel 112 of an electronic device 100 according to an embodiment of the disclosure. FIG. 3 is a schematic view of an arrangement of conductive lines of a pixel circuit 113 of an electronic device 100 according to an embodiment of the disclosure. FIG. 4 is a cross-sectional view taken along a line A-A' in FIG. 3. The electronic device 100 may include a display panel 110, and the display panel 110 may at least include a substrate 111, a pixel 112, a driving circuit 120, a driving circuit 130 and a driving circuit 140.

In addition, in FIG. 1, the number of the pixel 112 is shown as one, but the disclosure is not limited thereto. In some embodiments, the number of the pixel 112 may be multiple, and the pixels 112 are arranged in a matrix and are disposed on the substrate 111. Please refer to FIG. 2. The pixel 112 includes a pixel circuit 113 and a light-emitting unit 114 coupled to the pixel circuit 113. The pixel circuit 113 may be disposed on the substrate 111, and the pixel circuit 113 is configured to drive the light-emitting unit 114.

A first terminal of the light-emitting unit 114 may be coupled to the pixel circuit 113, and a second terminal of the light-emitting unit 114 may be coupled to the conductive line LVSS, so as to receive a reference voltage VSS (such as a ground voltage). In the embodiment, the light-emitting unit 114 may be the OLED, the LED, other suitable materials, or a combination thereof, but the disclosure is not limited thereto. The first terminal of the light-emitting unit 114 may be an anode, and the second terminal of the light-emitting unit 114 may be a cathode, but the disclosure is not limited thereto.

The pixel circuit 113 may include a capacitor C1, a transistor T1, a transistor T2, a transistor T3, a transistor T4, a transistor T5, a transistor T6, a transistor T7, a conductive line Vini1, a conductive line SN11-1, a conductive line SN12-1, a conductive line EM1, a conductive line SN21-1, a conductive line SN22-1, a conductive line LDATA and a conductive line LVDD, as shown in FIG. 2, but the disclosure is not limited thereto.

The capacitor C1 has a first terminal and a second terminal. The first terminal of the capacitor C1 is coupled to the conductive line LVDD, so as to receive a reference voltage VDD (such as a working voltage).

Each of the transistor T1, the transistor T2, the transistor T3, the transistor T4, the transistor T5, the transistor T6 and the transistor T7 includes a gate, a channel region, a source region and a drain region. The channel region, the source region and the drain region may be formed by a semiconductor layer. The channel region and the gate are overlapped. In one embodiment, a conductor layer may be coupled to the source region and the drain region through the via to form a source electrode and a drain electrode. The semiconductor layer may include a silicon semiconductor, an oxide semiconductor, other suitable materials, or a combination thereof, but the disclosure is not limited thereto. The silicon semiconductor may include an amorphous silicon semiconductor, a single crystalline silicon semiconductor, a poly-silicon semiconductor, or other suitable materials, but the disclosure is not limited thereto. The oxide semiconductor may include an indium gallium zinc oxide (IGZO) semiconductor, or other suitable materials, but the disclosure is not limited thereto. The transistor may include a bottom gate transistor, a top gate transistor, a double gate transistor or a combination thereof, but the disclosure is not limited thereto. Furthermore, when the transistor includes different semiconductor layers, the source region and the drain region (or the source electrode and the drain electrode) of the transistor may be interchanged, but the disclosure is not limited thereto.

In an embodiment, the pixel circuit 113 may include at least part of the conductor layer. The conductor layer may include a conductive line and coupled to a gate of one transistor, and the conductive line may have signal and control the transistor through the gate. Furthermore, if different transistor may share the semiconductor, i.e., a drain region of a transistor is coupled to a source region of another transistor, then the half of an region between the two channels belongs the drain region of one transistor, and the other half belongs the source region of another transistor.

The transistor T1 has a gate, a first terminal 1 and a second terminal 2. The gate of the transistor T1 is coupled to the second terminal of the capacitor C1. In the embodiment, the transistor T1 may be a low temperature poly-silicon (LTPS) semiconductor P-type thin film transistor, but the disclosure is not limited thereto. At this time, the first terminal 1 of the transistor T1 is, for example, the drain region, and the second terminal 2 of the transistor T1 is, for example, the source region. In another embodiment, the first terminal 1 of the transistor T1 is, for example, the source region, and the second terminal 2 of the transistor T1 is, for example, the drain region, but the disclosure is not limited thereto. In some embodiments, the transistor T1 may also be the low temperature poly-silicon semiconductor N-type thin film transistor, or the oxide (such as the indium gallium zinc oxide) semiconductor thin film transistor, but the disclosure is not limited thereto.

The transistor T2 has a gate, a first terminal 1 and a second terminal 2. The gate of the transistor T2 is coupled to the conductive line SN11-1, so as to receive a control signal (such as a scanning driving signal). The first terminal 1 of the transistor T2 is coupled to the conductive line LDATA, so as to receive a data signal. The second terminal 2 of the transistor T2 is coupled to the first terminal 1 of the transistor T1. In the embodiment, the transistor T2 may be the low temperature poly-silicon semiconductor P-type thin film transistor. The first terminal 1 of the transistor T2 is, for example, the drain region, and the second terminal 2 of the transistor T2 is, for example, the source region. In another embodiment, the first terminal 1 of the transistor T2 is, for example, the source region, and the second terminal 2 of the transistor T2 is, for example, the drain region, but the disclosure is not limited thereto. In some embodiments, the transistor T2 may also be the low temperature poly-silicon semiconductor N-type thin film transistor, or the oxide (such as the indium gallium zinc oxide) semiconductor thin film transistor, but the disclosure is not limited thereto.

The transistor T3 has a gate, a first terminal 1 and a second terminal 2. The gate of the transistor T3 is coupled to the conductive line SN22-1, so as to receive the control signal (such as the scanning driving signal). The first terminal 1 of the transistor T3 is coupled to the gate of the transistor T1. The second terminal 2 of the transistor T3 is coupled to the conductive line Vini, so as to receive a reference signal (such as a common signal), for example, a signal used to reset the light-emitting unit 114. In the embodiment, the transistor T3 may be the indium gallium zinc oxide semiconductor P-type thin film transistor, but the disclosure is not limited thereto. The first terminal 1 of the transistor T3 is, for example, the source region, and the second terminal 2 of the transistor T3 is, for example, the drain region. In another embodiment, the first terminal 1 of the transistor T3 is, for example, the drain region, and the second terminal 2 of the transistor T3 is, for example, the source region, but the disclosure is not limited thereto. In some embodiments, the transistor T3 may also be the indium gallium zinc oxide semiconductor N-type thin film transistor, or the silicon semiconductor (such as the low temperature poly-silicon semiconductor) thin film transistor, but the disclosure is not limited thereto.

The transistor T4 has a gate, a first terminal 1 and a second terminal 2. The gate of the transistor T4 is coupled to the conductive line EM1, so as to receive a control signal (such as an emission signal). The first terminal 1 of the transistor T4 is coupled to the conductive line LVDD, so as to receive the reference voltage VDD (such as the working voltage). The second terminal 2 of the transistor T4 is coupled to the second terminal 2 of the transistor T2. In the embodiment, the transistor T4 may be the low temperature poly-silicon semiconductor P-type thin film transistor. The first terminal 1 of the transistor T4 is, for example, the drain region, and the second terminal 2 of the transistor T4 is, for example, the source region. In another embodiment, the first terminal 1 of the transistor T4 is, for example, the source region, and the second terminal 2 of the transistor T4 is, for example, the drain region, but the disclosure is not limited thereto. In some embodiments, the transistor T4 may also be the low temperature poly-silicon semiconductor N-type thin film transistor, or the oxide (such as the indium gallium zinc oxide) semiconductor thin film transistor, but the disclosure is not limited thereto.

The transistor T5 has a gate, a first terminal 1 and a second terminal 2. The gate of the transistor T5 is coupled to the gate of the transistor T4 and the conductive line EM1. The first terminal 1 of the transistor T5 is coupled to the second terminal 2 of the transistor T1. The second terminal 2 of the transistor T5 is coupled to the first terminal of the light-emitting unit 114. In the embodiment, the transistor T5 may be the low temperature poly-silicon semiconductor P-type thin film transistor. The first terminal 1 of the transistor T5 is, for example, the drain region, and the second terminal 2 of the transistor T5 is, for example, the source region. In another embodiment, the first terminal 1 of the transistor T5 is, for example, the source region, and the second terminal 2 of the transistor T5 is, for example, the drain region, but the disclosure is not limited thereto. In some embodiments, the transistor T5 may also be the low temperature poly-silicon semiconductor N-type thin film transistor, or the oxide (such as the indium gallium zinc oxide) semiconductor thin film transistor, but the disclosure is not limited thereto.

The transistor T6 has a gate, a first terminal 1 and a second terminal 2. The gate of the transistor T6 is coupled to the conductive line SN21-1, so as to receive the control signal (such as the scanning driving signal). The first terminal 1 of the transistor T6 is coupled to the gate of the transistor T1. The second terminal 2 of the transistor T6 is coupled to the second terminal 2 of the transistor T1. In the embodiment, the transistor T6 may be the indium gallium zinc oxide semiconductor P-type thin film transistor. The first terminal 1 of the transistor T6 is, for example, the drain region, and the second terminal 2 of the transistor T6 is, for example, the source region. In another embodiment, the first terminal 1 of the transistor T6 is, for example, the source region, and the second terminal 2 of the transistor is, for example, the drain region but the disclosure is not limited thereto. In some embodiments, the transistor T6 may also be the indium gallium zinc oxide semiconductor N-type thin film transistor, or the silicon semiconductor (such as the low temperature poly-silicon semiconductor) thin film transistor, but the disclosure is not limited thereto.

The transistor T7 has a gate, a first terminal 1 and a second terminal 2. The gate of the transistor T7 is coupled to the conductive line SN12-1, so as to receive the control signal (such as the scanning driving signal). The first terminal 1 of the transistor T7 is coupled to the conductive line Vini1, so as to receive the reference signal (such as the common signal). The second terminal 2 of the transistor T7 is coupled to the second terminal 2 of the transistor T5. In the embodiment, the transistor T7 may be the low temperature poly-silicon semiconductor P-type thin film transistor. The first terminal 1 of the transistor T7 is, for example, the drain region, and the second terminal 2 of the transistor T7 is, for example, the source region. In another embodiment, the first terminal 1 of the transistor T7 is, for example, the source region, and the second terminal 2 of the transistor T7 is, for example, the drain region, but the disclosure is not limited thereto. In some embodiments, the transistor T7 may also be the low temperature poly-silicon semiconductor N-type thin film transistor, or the oxide (such as the indium gallium zinc oxide) semiconductor thin film transistor, but the disclosure is not limited thereto.

The conductive line SN11-1 and the conductive line SN12-1 are coupled to the driving circuit 120, and the driving circuit 120 is configured to provide corresponding control signals (such as scanning driving signals). The conductive line SN21-1 and the conductive line SN22-1 are coupled to the driving circuit 130, and the driving circuit 130 is configured to provide corresponding control signals (such as scanning driving signal). The conductive line LDATA and the conductive line LVDD is coupled to the driving circuit 140, and the driving circuit 140 is configured to provide a data signal and a reference voltage VDD (such as the working voltage).

In some embodiments, the conductive line SN11-1, the conductive line SN12-1, the conductive line EM1, the conductive line Vini1, the conductive line Vini2, the conductive line SN21-1 and the conductive line SN22-1 may be disposed on different layer and made of different metal layers, as shown in FIG. 4. For example, the conductive line SN11-1, the conductive line SN12-1 and the conductive line EM1 are disposed on a first layer and made of a first metal layer, the conductive line Vini1 and the conductive line Vini2 are disposed on a second layer and made of a second metal layer, and the conductive line SN21-1 and the conductive line SN22-1 are disposed on a third layer and made of a third metal layer, wherein the first layer, the second layer and the third layer are different layers, but the disclosure is not limited thereto. In some embodiments, when a plurality of pixels are arranged along the Y direction, the conductive line Vini1 and the conductive line Vini2 may be shared with adjacent pixels, and depending on the arrangement of the conductive lines, the different conductive lines may be shared with adjacent pixels, but the disclosure is not limited thereto.

In some embodiments, the conductive line SN11-1, the conductive line SN12-1, the conductive line EM1, the conductive line Vini1, the conductive line SN21-1 and the conductive line SN22-1 may receive the different signals. In the embodiment, for example, different signals may be distinguished by a result (for example, the transistor is turned on or off; or the light-emitting unit emits light or does not emits light, etc.), a use (for example, as a switching transistor; or as a fixed voltage level; or as a driving voltage signal; or as a data signal, etc.), a magnitude of voltage value, the difference in frequency generated by the signal of the electronic device 100, but the disclosure is not limited thereto.

In some embodiments, the conductive line SN11-1, the conductive line SN12-1, the conductive line EM1, the conductive line Vini1, the conductive line Vini2, the conductive line SN21-1, and the conductive line SN22-1 may extend along the same direction, such as the X direction, but the disclosure is not limited thereto.

In some embodiments, the conductive line SN11-1 may be a conductive line, the conductive line SN21-1 may be a second conductive line, the conductive line Vini1 may be a third conductive line and the conductive line Vini2 may be a fourth conductive line, but the disclosure is not limited thereto. In the embodiment, the conductive line SN11-1 may be disposed adjacent to the conductive line SN21-1, and the conductive line SN11-1 and the conductive line SN21-1 are disposed, for example, between the conductive line Vini1 and the conductive line Vini2. Here, the conductive line SN11-1 is disposed adjacent to the conductive line SN21-1, which indicates that no other conductive lines are disposed between two conductive lines. In addition, in the Y direction, a distance between the conductive line SN11-1 and the conductive line SN21-1 may be a distance Y1 (such as the first distance) and a distance between the conductive line Vini1 and the conductive line Vini2 may be a distance Y2 (such as the second distance). For example, the distance Y1 is the distance between the same sides of the conductive line SN11-1 and the conductive line SN21-1 perpendicular to the extension direction (such as the X direction) of the conductive line SN11-1 and the conductive line SN21-1. That is, the distance Y1 is the distance between the same sides of the conductive line SN11-1 and the conductive line SN21-1 in the Y direction. The distance Y2 is, for example, the distance between the same sides of the conductive line Vini1 and the conductive line Vini2 in the Y direction. Furthermore, the distance Y1 is, for example, the distance between the sides of the conductive line SN11-1 and the conductive line SN21-1 close to the IC bonding region, and the distance Y2 is, for example, the distance between the sides of the conductive line Vini1 and the conductive line Vini2 close to the IC bonding region, but the disclosure is not limited thereto.

Please refer to FIG. 3. In a top view direction (a normal direction of the substrate 111, such as a Z direction), the conductive line SN11-1, the conductive line SN12-1, the conductive line EM1, the conductive line Vini1, the conductive line SN21-1 and the conductive line SN22-1 may be made of metal layers on different layers. Therefore, the distances of the metal layers on different layers in the Y direction may be shortened, or the metal layers on different layers may be overlapped.

In addition, for example, the distance Y1 and the distance Y2 conform to the following relationship: $0 \leq Y1/Y2 \leq 0.25$. Furthermore, for example, the distance Y1 and the distance Y2 conform to the following relationship: $0 \leq Y1/Y2 \leq 0.102$. Moreover, the distance Y2 is, for example, 40 micrometers (um), 50 micrometers, 70 micrometers, 98 micrometers, etc., but the disclosure is not limited thereto. Therefore, when the distance between the conductive lines is shortened, the pixels per inch (PPI) of the display panel may be increased under the same size, or the display panel may increase the region that is not shielded by the conductive lines.

In some embodiments, the conductive line SN11-1 may be the first conductive line, the conductive line SN22-1 may be the second conductive line, the conductive line Vini1 may be the third conductive line and the conductive line Vini2 may be the fourth conductive line, but the disclosure is not limited thereto. In the embodiment, conductive line SN11-1 may be disposed adjacent to the conductive line SN22-1, and the conductive line SN11-1 and the conductive line SN22-1 are disposed, for example, between the conductive line Vini1 and the conductive line Vini2. Here, the conductive line SN11-1 is disposed adjacent to the conductive line SN22-1, which indicates that no other conductive lines are disposed between two conductive lines. In addition, in the Y direction, the distance between the conductive line SN11-1 and the conductive line SN22-1 may be the distance Y1 (not shown), and the distance between the conductive line Vini1 and the conductive line Vini2 may be the distance Y2.

Figure 6:
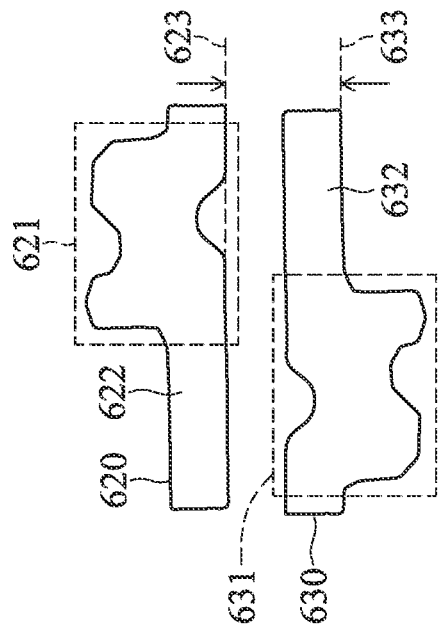
FIG. 6 is a schematic view of a conductive line according to another embodiment of the disclosure.
Figure 5:
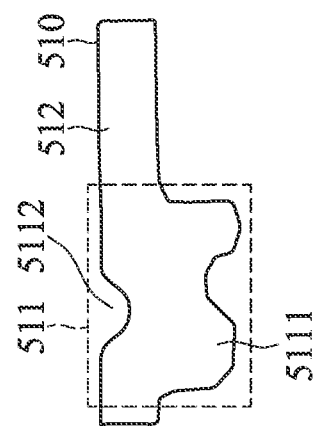
FIG. 5 is a schematic view of a conductive line according to an embodiment of the disclosure.

In FIG. 3, the extending directions of the sides of the conductive line Vini1, the conductive line SN11-1, the conductive line SN12-1, the conductive line EM1, the conductive line SN21-1 and the conductive line SN22-1 are approximately parallel to the extending direction of the conductive line, but the disclosure is not limited thereto. In some embodiments, as shown in a conductive line 510 in FIG. 5 or a conductive line 620 and a conductive line 630 in FIG. 6, the edge curvature of the side of a part region of the conductive line changes, so the extending direction of the part region is not parallel to the extending direction of the conductive line. In FIG. 5, it can be seen that the conductive line 510 includes a non-straight portion 511 and a straight portion 512. The edge curvature of the non-straight portion 511 changes (for example, a protrusion 5111 or a recess 5112). Therefore, the distance measurement is based on the straight portion 512 of the conductive line 510. In addition, as shown in FIG. 6, straight portions 622 and 632 of the two conductive lines 620 and 630 may not be correspondingly arranged. For example, the straight portion 622 of the conductive line 620 may correspond to the non-straight portion 631 of the conductive line 630, and the non-straight portion 621 of the conductive line 620 may correspond to the straight portion 632 of the conductive line 630. Therefore, in the measurement of distance, the extending line 623 on one side of the straight portion 622 of the conductive line 620 and the extending line 633 on one side of the straight portion 632 of the conductive line 630 may be used as the basis to measure the distance.

Figure 7B:
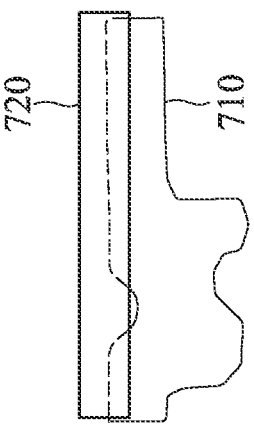
FIG. 7B is a schematic view of a conductive line according to another embodiment of the disclosure.
Figure 7A:
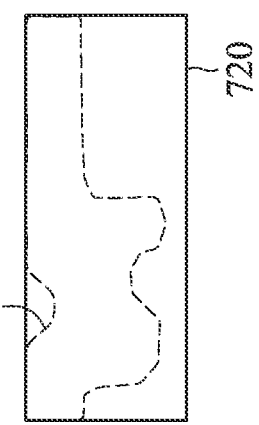
FIG. 7A is a schematic view of a conductive line according to another embodiment of the disclosure.

In addition, in some embodiments, when the conductive line 710 and the conductive line 720 at least partially overlap, it indicates that the distance between the conductive line 710 and the conductive line 720 is 0, as shown in FIG. 7A (completely overlapped) or FIG. 7B (partially overlapped).

FIG. 8A is a schematic view of an arrangement of conductive lines of a pixel circuit of an electronic device according to another embodiment of the disclosure. In the pixel circuit 113 of FIG. 8A, the conductive line SN11-1 and the conductive line SN22-1 at least partially overlap in the Z direction. In the embodiment, the distance Y1 may be the distance (such as 0) between the conductive line SN11-1 and the conductive line SN22-1 (such as the first conductive line and the second conductive line that receive different signals or located on different layers), or the distance between the conductive line SN11-1 and the conductive line SN21-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

FIG. 8B is a schematic view of an arrangement of conductive lines of a pixel circuit of an electronic device according to another embodiment of the disclosure. In the pixel circuit 113 of FIG. 8B, the conductive line SN11-1 and the conductive line SN21-1 at least partially overlap in the Z direction. In the embodiment, the distance Y1 may be the distance (such as 0) between the conductive line SN11-1 and the conductive line SN21-1 (such as the first conductive line and the second conductive line that receive different signals or located on different layers), or the distance between the conductive line SN11-1 and the conductive line SN22-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

Figure 9A:
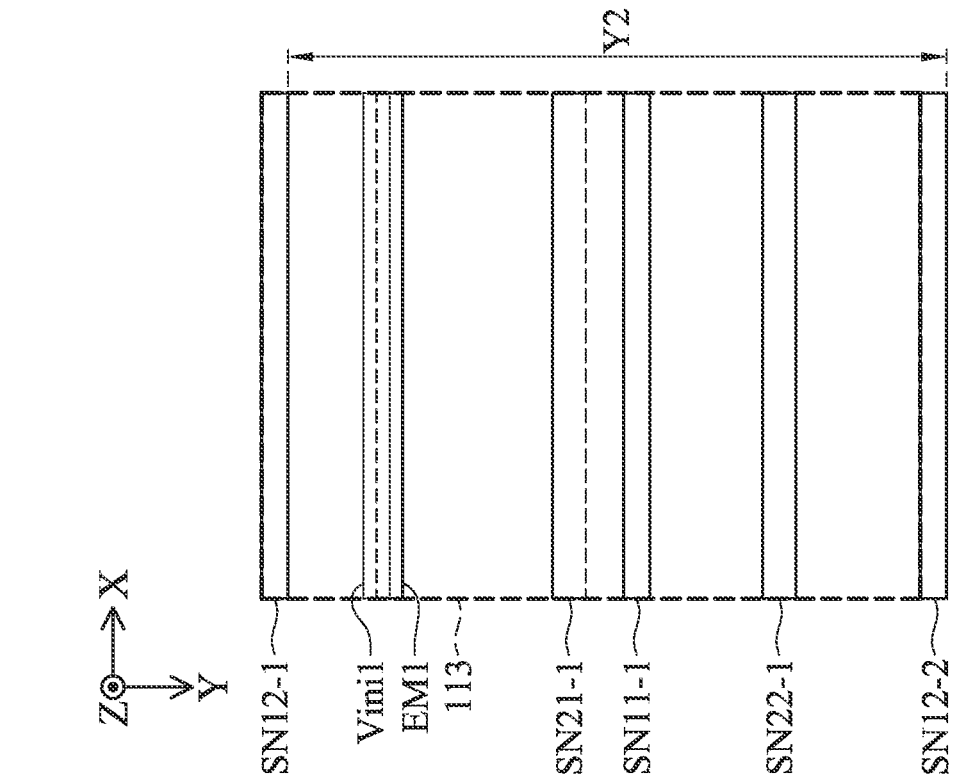
FIG. 9A is a schematic view of an arrangement of conductive lines of a pixel circuit of an electronic device according to another embodiment of the disclosure.

FIG. 9A is a schematic view of an arrangement of conductive lines of a pixel circuit of an electronic device according to another embodiment of the disclosure. In the pixel circuit 113 of FIG. 9A, the conductive line Vini2 and the conductive line SN12-2 at least partially overlap in the Z direction, and the conductive line SN11-1 and the conductive line SN21-1 at least partially overlap in the Z. In the embodiment, the distance Y1 may be the distance (such as 0) between the conductive line SN11-1 and the conductive line SN21-1 (such as the first conductive line and the second conductive line that receive different signals or located on different layers), or the distance between the conductive line SN11-1 and the conductive line SN22-1 (such as the first conductive line and the second conductive line that receive different signals or located on different layers), or the distance (such as 0) between the conductive line Vini2 and the conductive line SN12-2 (such as the first conductive line and the second conductive line that receive different signals or located on different layers). The distance Y2 may be the distance between the conductive line EM1 and the conductive line EM2 (such as the third conductive line and the fourth conductive line that receive the same type of signals).

Figure 9B:
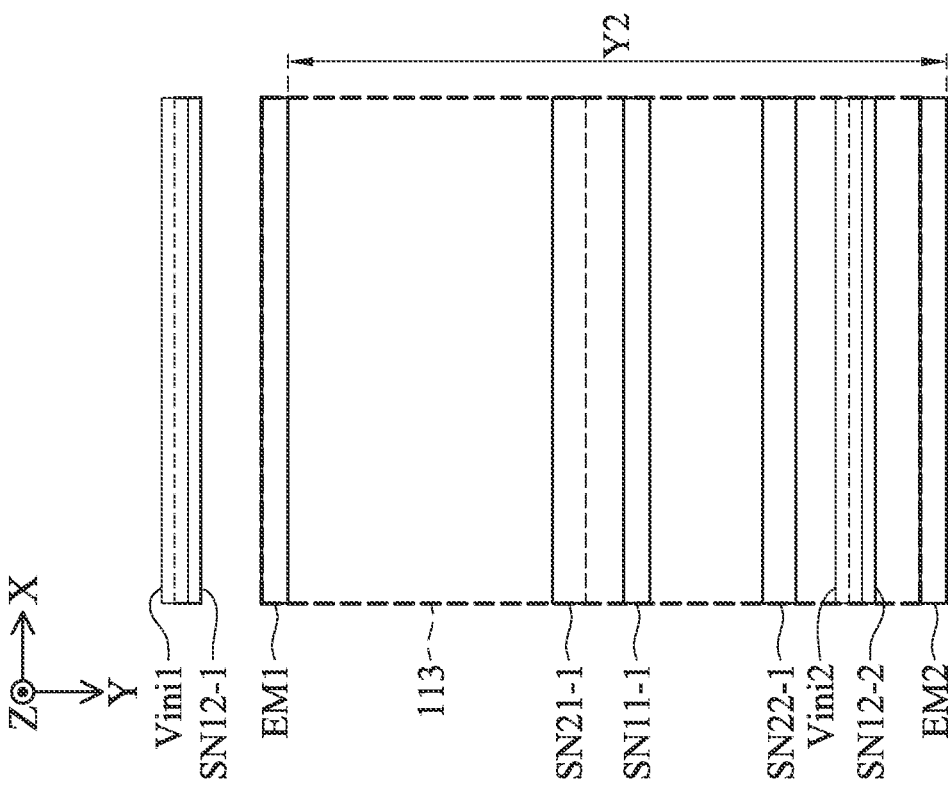
FIG. 9B is a schematic view of an arrangement of conductive lines of a pixel circuit of an electronic device according to another embodiment of the disclosure.

FIG. 9B is a schematic view of an arrangement of conductive lines of a pixel circuit of an electronic device according to another embodiment of the disclosure. In the pixel circuit 113 of FIG. 9B, the conductive line Vini1 and the conductive line EM1 at least partially overlap in the Z direction. In the embodiment, the distance Y1 may be the distance between the conductive line SN11-1 and the conductive line SN21-1 (such as the first conductive line and the second conductive line that receive different signals or located on different layers), or the distance between the conductive line SN11-1 and the conductive line SN22-1 (such as the first conductive line and the second conductive line that receive different signals or located on different layers), or the distance (such as 0) between the conductive line Vini1 and the conductive line EM1 (such as the first conductive line and the second conductive line that receive different signals or located on different layers). The distance Y2 may be the distance between the conductive line SN12-1 and the conductive line SN12-2 (such as the third conductive line and the fourth conductive line that receive the same type of signals).

FIG. 10A is a schematic view of an arrangement of conductive lines of a pixel circuit of an electronic device according to another embodiment of the disclosure. In the pixel circuit 113 of FIG. 10A, the conductive line Vini1 and the conductive line SN12-1 at least partially overlap in the Z direction, and the conductive line SN11-1 and the conductive line SN22-1 at least partially overlap in the Z direction. In the embodiment, the distance Y1 may be the distance between the conductive line SN11-1 and the conductive line SN21-1 (such as the first conductive line and the second conductive line that receive different signals or located on different layers), or the distance (such as 0) between the conductive line SN11-1 and the conductive line SN22-1 (such as the first conductive line and the second conductive line that receive different signals or located on different layers), or the distance (such as 0) between the conductive line Vini1 and the conductive line SN12-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

FIG. 10B is a schematic view of an arrangement of conductive lines of a pixel circuit of an electronic device according to another embodiment of the disclosure. In the pixel circuit 113 of FIG. 10B, the conductive line Vini1 and the conductive line EM1 at least partially overlap in the Z direction, and the conductive line SN11-1 and the conductive line SN22-1 at least partially overlap in the Z direction. In the embodiment, the distance Y1 may be the distance between the conductive line SN11-1 and the conductive line SN21-1 (such as the first conductive line and the second conductive line that receive different signals or located on different layers), or the distance (such as 0) between the conductive line SN11-1 and the conductive line SN22-1 (such as the first conductive line and the second conductive line that receive different signals or located on different layers), or the distance (such as 0) between the conductive line Vini1 and the conductive line EM1 (such as the first conductive line and the second conductive line that receive different signals or located on different layers). The distance Y2 may be the distance between the conductive line SN12-1 and the conductive line SN12-2 (such as the third conductive line and the fourth conductive line that receive the same type of signals).

Figures 11A, 11B:
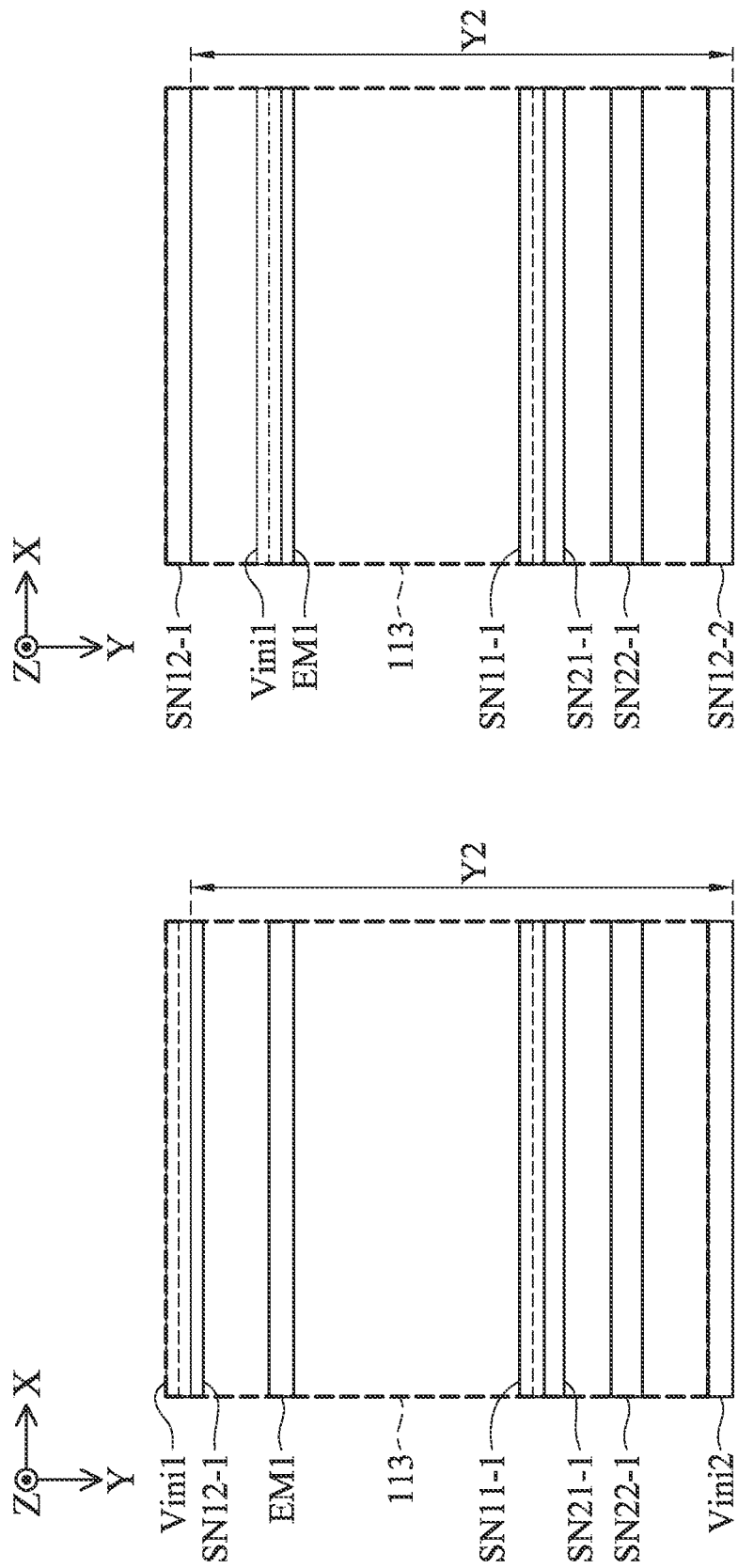
FIG. 11A is a schematic view of an arrangement of conductive lines of a pixel circuit of an electronic device according to another embodiment of the disclosure.
FIG. 11B is a schematic view of an arrangement of conductive lines of a pixel circuit of an electronic device according to another embodiment of the disclosure.

FIG. 11A is a schematic view of an arrangement of conductive lines of a pixel circuit of an electronic device according to another embodiment of the disclosure. In the pixel circuit 113 of FIG. 11A, the conductive line Vini1 and the conductive line SN12-1 at least partially overlap in the Z direction, and the conductive line SN11-1 and the conductive line SN21-1 at least partially overlap in the Z direction. In the embodiment, the distance Y1 may be the distance between the conductive line SN11-1 and the conductive line SN22-1 (such as the first conductive line and the second conductive line that receive different signals or located on different layers), or the distance (such as 0) between the conductive line SN11-1 and the conductive line SN21-1 (such as the first conductive line and the second conductive line that receive different signals or located on different layers), or the distance (such as 0) between the conductive line Vini1 and the conductive line SN12-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

FIG. 11B is a schematic view of an arrangement of conductive lines of a pixel circuit of an electronic device according to another embodiment of the disclosure. In the pixel circuit 113 of FIG. 11B, the conductive line Vini1 and the conductive line EM1 at least partially overlap in the Z direction, and the conductive line SN11-1 and the conductive line SN21-1 at least partially overlap in the Z direction. In the embodiment, the distance Y1 may be the distance between the conductive line SN11-1 and the conductive line SN22-1 (such as the first conductive line and the second conductive line that receive different signals or located on different layers), or the distance (such as 0) between the conductive line SN11-1 and the conductive line SN21-1 (such as the first conductive line and the second conductive line that receive different signals or located on different layers), or the distance (such as 0) between the conductive line Vini1 and the conductive line EM1 (such as the first conductive line and the second conductive line that receive different signals or located on different layers). The distance Y2 may be the distance between the conductive line SN12-1 and the conductive line SN12-2 (such as the third conductive line and the fourth conductive line that receive the same type of signals).

FIG. 12A is a schematic view of an arrangement of conductive lines of a pixel circuit of an electronic device according to another embodiment of the disclosure. In the pixel circuit 113 of FIG. 12A, the pixel circuit 113 may further includes a conductive line SN23-1 and a conductive line SN24-1, and the conductive line SN23-1 and the conductive line SN24-1 may be formed by conductor layers disposed under the semiconductor layer. The conductive line SN21-1 and the conductive line SN23-1 at least partially overlap in the Z direction, and the conductive line SN21-1 and the conductive line SN23-1 may be disposed on different layers and coupled to the gate of the transistor T6 of the pixel circuit 113, such that the transistor T6 has a function of double gate, so as to decrease a leakage current of the transistor T6. The conductive line SN22-1 and the conductive line SN24-1 at least partially overlap in the Z direction, and the conductive line SN22-1 and the conductive line SN24-1 may be disposed on different layers and coupled to the gate of the transistor T3 of the pixel circuit 113, such that the transistor T3 has a function of double gate, so as to decrease a leakage current of the transistor T3. In FIG. 12A, it can further seen that the conductive line SN11-1 at least partially overlap the conductive line SN22-1 and the conductive line SN24-1 in the Z direction.

In the embodiment, the distance Y1 may be the distance between the conductive line SN11-1 and the conductive line SN21-1 (such as the first conductive line and the second conductive line that receive different signals or located on different layers), or the distance (such as 0) between the conductive line SN11-1 and the conductive line SN22-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

FIG. 12B is a schematic view of an arrangement of conductive lines of a pixel circuit of an electronic device according to another embodiment of the disclosure. FIG. 12B is similar to FIG. 12A, wherein the description of the conductive line SN21-1, the conductive line SN23-1, the conductive line SN22-1 and the conductive line SN24-1 may be deduced by analogy from the embodiment of FIG. 12A, and the description thereof is not repeated herein. In addition, in FIG. 12B, it can be seen that the conductive line SN11-1 at least partially overlap the conductive line SN21-1 and the conductive line SN23-1. In the embodiment, the distance Y1 may be the distance between the conductive line SN11-1 and the conductive line SN21-1 (such as the first conductive line and the second conductive line that receive different signals or located on different layers), or the distance (such as 0) between the conductive line SN11-1 and the conductive line SN22-1 (such as the first conductive line and the second conductive line that receive different signals or located on different layers). The distance Y2 may be the distance between the conductive line Vini1 and the conductive line Vini2 (such as the third conductive line and the fourth conductive line that receive the same type of signals).

Figure 13A:
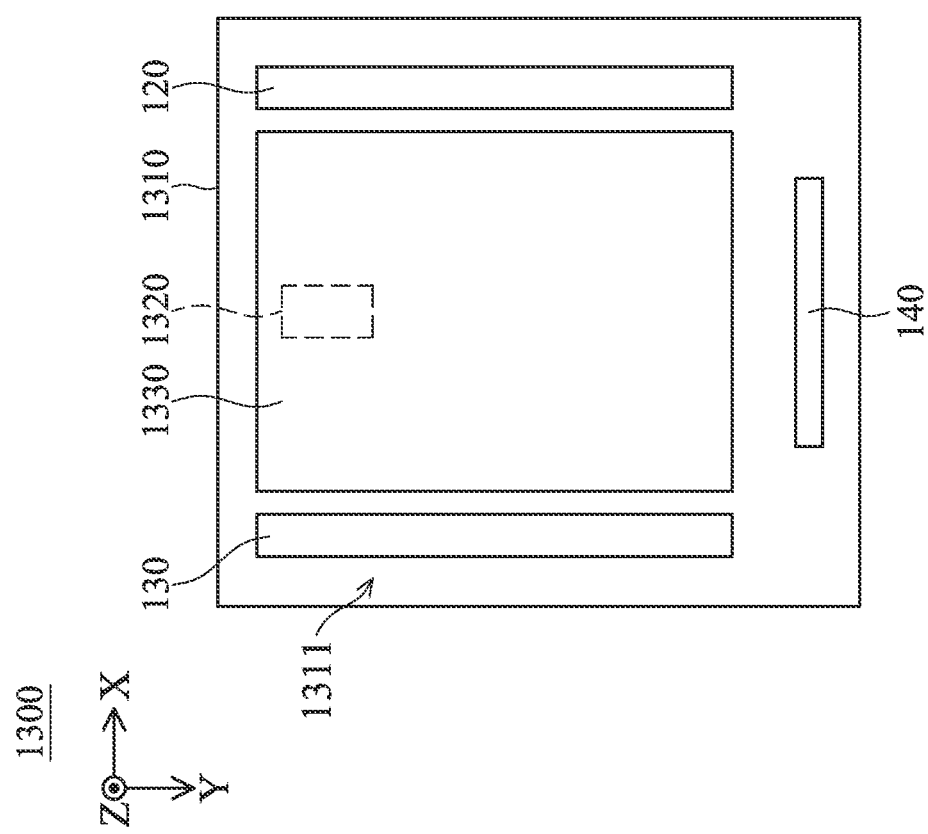
FIG. 13A is a schematic view of an electronic device according to another embodiment of the disclosure.
Figures 13B, 13C:
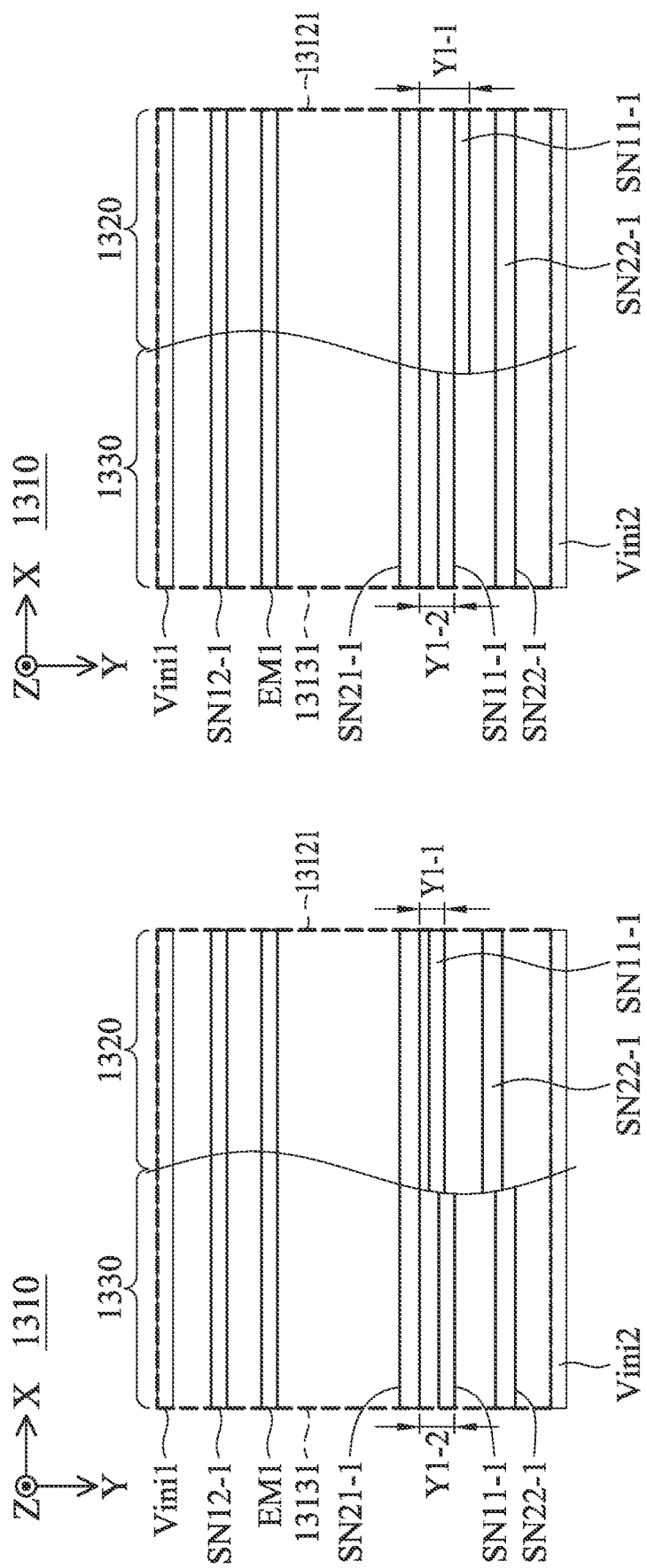
FIG. 13B is a schematic view of an arrangement of conductive lines of a pixel circuit of an electronic device according to another embodiment of the disclosure.
FIG. 13C is a schematic view of an arrangement of conductive lines of a pixel circuit of an electronic device according to another embodiment of the disclosure.

FIG. 13A is a schematic view of an electronic device according to another embodiment of the disclosure. FIG. 13B is a schematic view of an arrangement of conductive lines of a pixel circuit of an electronic device according to another embodiment of the disclosure. FIG. 13C is a schematic view of an arrangement of conductive lines of a pixel circuit of an electronic device according to another embodiment of the disclosure. The electronic device 1300 of FIG. 13A is similar to the electronic device 100 of FIG. 1. Please refer to FIG. 13A, FIG. 13B and FIG. 13C. The electronic device 1300 includes a display panel 1310, and the display panel 1310 may at least include a substrate 1311, a pixel 1312, a pixel 1313, a driving circuit 120, a driving circuit 130 and a driving circuit 140. In the embodiment, the driving circuit 120, the driving circuit 130 and the driving circuit 120 in FIG. 13A are the same as or similar to driving circuit 120, the driving circuit 130 and the driving circuit 120 in FIG. 1 and may be deduced by analogy from the description of the embodiment of FIG. 1, and the description thereof is not repeated herein. In the embodiment, the pixel 1312 and the pixel 1313 in FIG. 13A are the same as or similar to the pixel 112 in FIG. 1 and may be deduced by analogy from the description of the embodiment of FIG. 1, and the description thereof is not repeated herein.

Please refer to FIG. 13A and FIG. 13B. The display panel 1310 includes a sensing region 1320 and a non-sensing region 1330 adjacent to the sensing region 1320, and the sensing region 1320 and the non-sensing region 1330 are disposed on the substrate 1311. A sensing element (not shown) may be disposed under the sensing region 1320, i.e., the sensing region may overlap the sensing element. The sensing element may be, for example, an infrared sensor, a camera, a light sensor, etc., but the disclosure is not limited thereto. The sensing region 1320 may have higher transparency, which improves the light signal that may pass through the display panel and may be sensed by the sensing element.

In addition, the non-sensing region 1330 and a part of the sensing region 1320 may be, for example, a display region of the display panel 1310.

The pixel 1312 may be disposed inside the sensing region 1320 of the display panel 1310, and the pixel 1313 may be disposed inside the non-sensing region 1330 of the display panel 1310. The pixel 1312 may include a pixel circuit 13121 and a light-emitting unit (not shown) coupled to the pixel circuit 13121, and the pixel 1313 may include a pixel circuit 13131 and a light-emitting unit (not shown) coupled to the pixel circuit 13131. In the embodiment, the pixel circuit 13121 and the pixel circuit 13131 are the same as or similar to the pixel circuit 113 of FIG. 2 and may be deduced by analogy from the description of the embodiment of FIG. 2, and the description thereof is not repeated herein. Each of the pixel circuit 13121 and the pixel circuit 13131 may at least include the conductive line Vini1, the conductive line SN12-1, the conductive line EM1, the conductive line SN21-1, the conductive line SN11-1 and the conductive line SN22-1. In the embodiment, the conductive line Vini1, the conductive line SN12-1, the conductive line EM1, the conductive line SN21-1 the conductive line SN11-1 and the conductive line SN22-1 in FIGS. 13B and 13C are the same as or similar to the conductive line Vini1, the conductive line SN12-1, the conductive line EM1, the conductive line SN21-1, the conductive line SN11-1 and the conductive line SN22-1 in FIG. 2 to FIG. 4 and may be deduced by analogy from the description of the embodiments of FIGS. 2 to FIG. 4, and the description thereof is not limited thereto. Similarly, the conductive line SN11-1, the conductive line SN12-1, the conductive line EM1, the conductive line Vini1, the conductive line Vini2 (shared with the next pixel), the conductive line SN21-1 and the conductive line SN22-1 may extend in the same direction, for example, in the X direction, but the disclosure is not limited thereto.

In some embodiments, the conductive line SN11-1 may be a first conductive line, and the conductive line SN21-1 may be a second conductive line, but the disclosure is not limited thereto. In addition, in the Y direction, a distance between the conductive line SN11-1 and the conductive line SN21-1 of the pixel circuit 13121 in the sensing region 1320 may be a distance Y1-1 (such as the first distance), and a distance between the conductive line SN11-1 and the conductive line SN21-1 of the pixel circuit 13131 in the non-sensing region 1330 may be a distance Y1-2 (such as the second distance). In the embodiment, the measurement manner of the distance Y1-1 and the distance Y1-2 may be deduced by analogy from the above embodiment of the distance Y1 and the distance Y2, and the description thereof is not repeated herein.

In the embodiment, the distance Y1-1 and the distance Y1-2 may be different. Furthermore, in some embodiments, the distance Y1-1 may be less than the distance Y1-2, as shown in FIG. 13B. In addition, in some embodiments, as shown in FIG. 13C, the distance Y1-1 may also be greater than the distance Y1-2. Therefore, by adjusting the relationship of the distance Y1-1 and the distance Y1-2, different region ranges may be adjusted to provide the sensing element (such as the infrared sensor, the camera, the light sensor, etc.) for use, so as to improve the sensing performance of the sensing element.

FIG. 14A is a schematic view of an electronic device according to another embodiment of the disclosure. FIG. 14B is a schematic view of a display panel according to an embodiment of the disclosure. The electronic device 1400 of FIG. 14A is similar to the electronic device 1300 of FIG. 13A, and the description thereof is not repeated herein. The electronic device 1400 includes a display panel 1310, and the display panel 1310 may at least includes a substrate 1311, a pixel 1312, a driving circuit 120_1, a driving circuit 120_2, a driving circuit 130_1, a driving circuit 130_2 and a driving circuit 140. The driving circuit 120_1 and the driving circuit 120_2 in FIG. 14A are the same as the driving circuit 120 in FIG. 13A, the driving circuit 130_1 and the driving circuit 130_2 in FIG. 14A are the same as or similar to the driving circuit 130 in FIG. 13A, and the driving 140 in FIG. 14A are the same as or similar to the driving circuit 140 in FIG. 13A. Accordingly, the driving circuit 120_1, the driving circuit 120_2, the driving circuit 130_1, the driving circuit 130_2 and the driving 140 in FIG. 14A may be deduced by analogy from the description of the embodiment of FIG. 13A, and the description thereof is not limited thereto.

Please refer to FIG. 14A and FIG. 14B. The display panel 1310 includes a sensing region 1320 and a non-sensing region 1330. The sensing region 1320 may be configured with a sensing element, such as an infrared sensor, a camera, a light sensor, etc., but the disclosure is not limited thereto. In addition, the non-sensing region 1330 and a part region of the sensing region 1320 may be a display region of the display panel 1310.

In addition, the conductive line SN11-1 to the conductive line SN11-7 may be correspondingly coupled to the driving circuit 120_1 and the driving circuit 120_2. For example, the conductive line SN11-2 may be coupled to the driving circuit 120_1, and the conductive line SN11-6 may be coupled to the driving circuit 120_2, but the disclosure is not limited thereto. The conductive line SN21-1 to the conductive lime SN21-7 may be correspondingly coupled to the driving circuit 130_1 and the driving circuit 130_2. For example, the conductive line SN21-2 may be coupled to the driving circuit 130_1, and the conductive line SN21-6 may be coupled to the driving circuit 130_2, but the disclosure is not limited thereto. The conductive line LDAT1, the conductive line LDATA2 and the conductive line LVDD may be correspondingly coupled to the driving circuit 140.

Figure 15A:
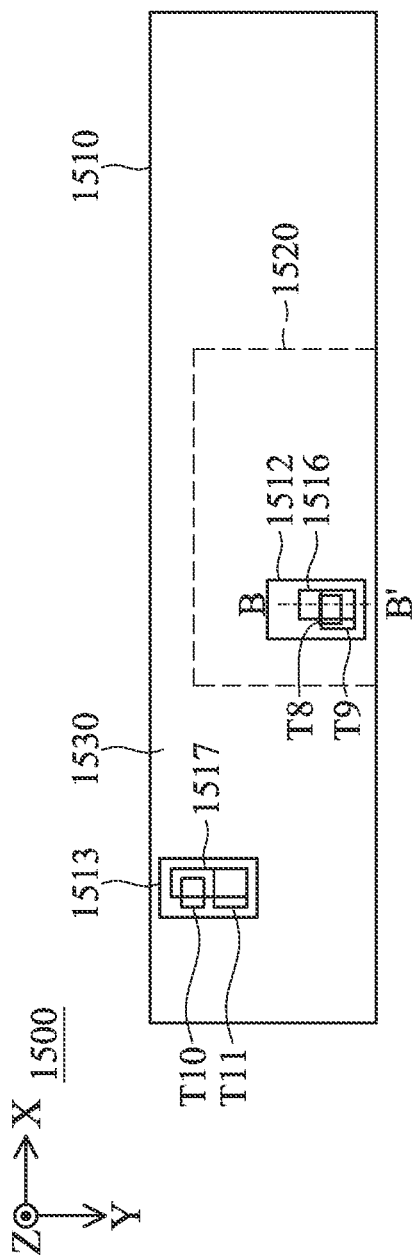
FIG. 15A is a schematic view of an electronic device according to an embodiment of the disclosure.
Figure 15B:
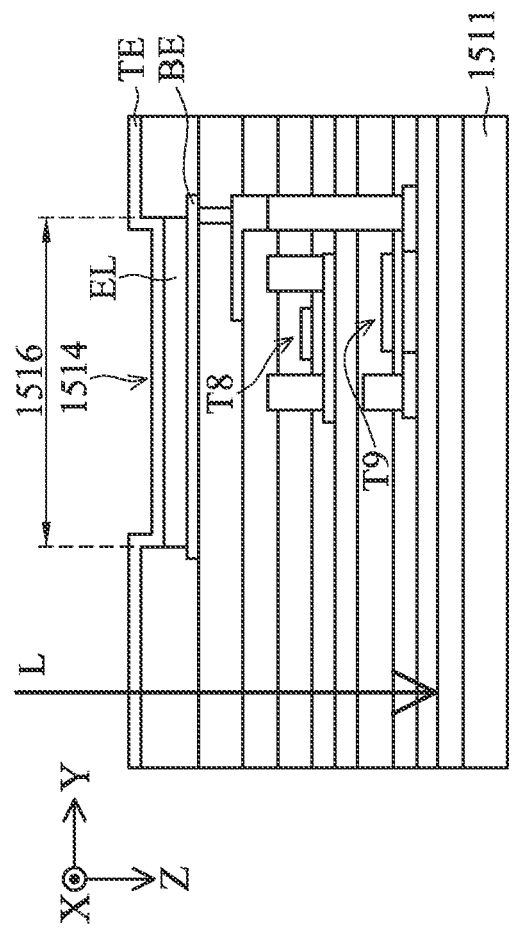
FIG. 15B is a cross-sectional view taken along a line B-B' in FIG. 15A.

FIG. 15A is a schematic view of an electronic device according to an embodiment of the disclosure. FIG. 15B is a cross-sectional view taken along a line B-B' in FIG. 15A. The electronic device 1500 of FIG. 15A is similar to the electronic device 1300 of FIG. 13A, and the description thereof is not repeated herein. Please refer to FIG. 15A and FIG. 15B. The electronic device 1500 includes a display panel 1510, and the display panel 1510 may at least include a substrate 1511, a pixel 1512 and a pixel 1513. The substrate 1511 includes a sensing region 1520 and a non-sensing region 1530. The sensing region 1520 may be configured with a sensing element, such as an infrared sensor, a camera, a light sensor, etc., and the sensing region is disposed under the substrate 1511, but the disclosure is not limited thereto. In addition, the non-sensing region 1530 is, for example, a display region of the display panel 1510.

The pixel 1512 may be disposed inside the sensing region 1520, and the pixel 1513 may be disposed inside the non-sensing region 1530. The pixel 1512 may at least include a transistor T8, a transistor T9 and a light-emitting unit 1514, wherein a region 1516 is a light-emitting region of the light-emitting unit 1514. The light-emitting unit 1514 may be, for example, the organic light-emitting diode, which includes a top electrode TE, a bottom electrode BE and a light-emitting layer EL between the top electrode TE and the bottom electrode BE, but the disclosure is not limited thereto. The transistor T8 and the transistor T9 may be partially overlapped in the Z direction, and are located under the light-emitting unit 1514. Therefore, the opaque region of the sensing region 1520 may be decreased to increase the transmittance of the light, and the external light L (as shown by the arrow in FIG. 15B) may pass through the light-transmissible region of the sensing region 1520 and be received by the sensing element. In addition, the pixel 1513 may at least include a transistor T10, a transistor T11 and a light-emitting unit (not shown), wherein a region 1517 is a light-emitting region of the light-emitting unit. The transistor T10 and the transistor T11 may be separately arranged in the Z direction, the transistor T10 and the transistor T11 may be arranged without overlapping in the Z direction, and the transistor T10 and the transistor T11 are located under the light-emitting unit (not shown), but the disclosure is not limited thereto.

In some embodiments, the transistor T8 and the transistor T10 are, for example, the oxide semiconductor (such as the indium gallium zinc oxide semiconductor) P-type or N-type thin film transistor, and the transistor T9 and the transistor T11 are, for example, the silicon semiconductor (such as the low temperature poly-silicon semiconductor) P-type or N-type thin film transistor, but the disclosure is not limited thereto.

Figure 16A:
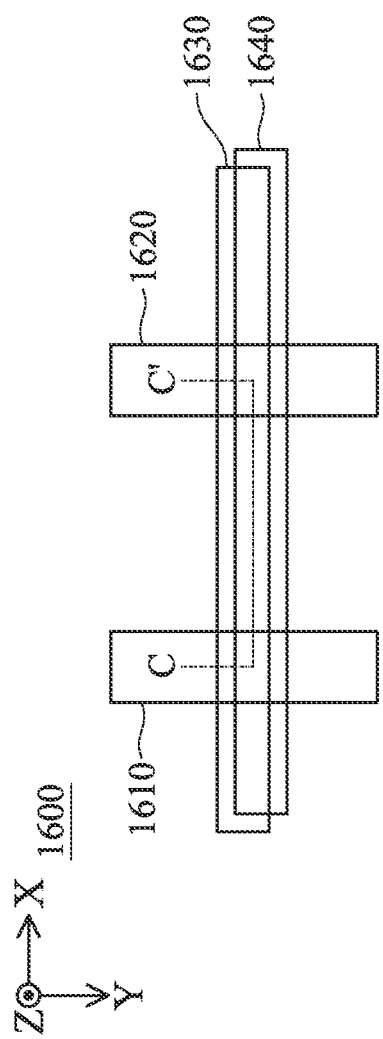
FIG. 16A is a top view of an arrangement relationship of semiconductor layers and conductive lines of a display panel according to an embodiment of the present disclosure.
Figure 16B:
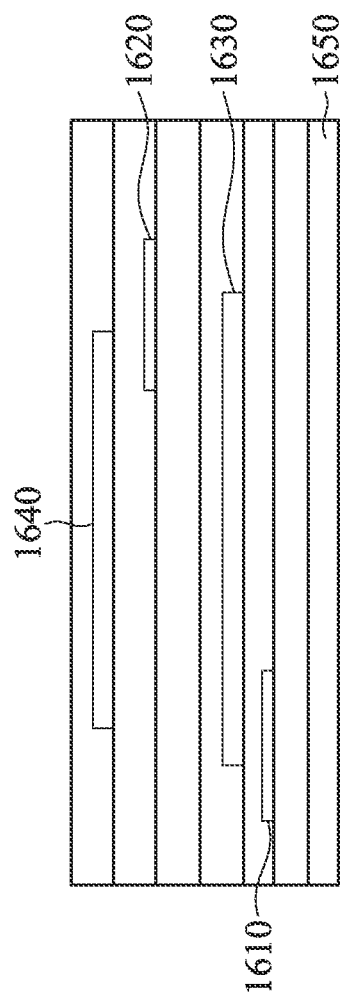
FIG. 16B is a cross-sectional view taken along a line C-C' in FIG. 16A.

FIG. 16A is a top view of an arrangement relationship of semiconductor layers and conductive lines of a display panel according to an embodiment of the present disclosure. FIG. 16B is a cross-sectional view taken along a line C-C' in FIG. 16A. Please refer to FIG. 16A and FIG. 16B. The display panel 1600 may include a semiconductor layer 1610, a semiconductor layer 1620, a conductive line 1630 and a conductive line 1640. The conductive line 1630 and the conductive line 1640 may be overlapped in the Z direction. In addition, on the substrate 1650, the semiconductor layer 1610, the conductive line 1630, the semiconductor layer 1620 and the conductive line 1640 are sequentially arranged. In the embodiment, the semiconductor layer 1610 is, for example, the silicon semiconductor layer (such as the low temperature poly-silicon semiconductor layer), the conductive line 1630 is, for example, a scan line for driving the silicon semiconductor transistor, the semiconductor layer 1620 is, for example, the oxide (such as the indium gallium zinc oxide) semiconductor layer, and the conductive line 1640 is, for example, a scan line for driving the oxide (such as the indium gallium zinc oxide) transistor, but the disclosure is not limited thereto. Since the conductive line 1630 and the conductive line 1640 may be partially overlapped in the Z direction, the area of the opaque region may be decrease to improve the transmittance of the light.

FIG. 17A is a cross-sectional view of semiconductor layers and the light shielding layers in a sensing region and a non-sensing region of a display panel according to an embodiment of the disclosure. Please refer to FIG. 17A. A substrate 1711 includes a sensing region 1720 and a non-sensing region 1710 adjacent to the sensing region 1720. A semiconductor layer 1730, a semiconductor layer 1740 and a light shielding layer 1731 are disposed in the non-sensing region 1710. A semiconductor layer 1750, a semiconductor layer 1760, a light shielding layer 1751 and a light shielding layer 1761 are disposed in the sensing region 1720. The semiconductor layer 1730 and the semiconductor layer 1740 may be disposed on different layers. The light shielding layer 1731 may be located under the semiconductor layer 1730. The semiconductor layer 1750 and the semiconductor layer 1760 may be disposed on different layers. The light shielding layer 1751 may be located under the semiconductor layer 1750. The light shielding layer 1761 may be located under the semiconductor layer 1760.

In the embodiment, the semiconductor layer 1730 and the semiconductor layer 1750 are, for example, the oxide semiconductor (such as the indium gallium zinc oxide semiconductor) layers, and disposed on the same layer. The semiconductor layer 1740 and the semiconductor layer 1760 are, for example, the silicon semiconductor (such as the low temperature poly-silicon semiconductor) layers, and disposed on the same layer. The light shielding layer 1731 and the light shielding layer 1751 may be disposed on the same layer, and the light shielding layer 1761 and the light shielding layer 1731 (or the light shielding layer 1751) may be disposed on different layers. The light shielding layer 1731, the light shielding layer 1751 and the light shielding layer 1761 may be a conductive layer with light shielding (such as the metal material), an organic layer (such as a black matrix), other suitable materials or a combination thereof, but the disclosure is not limited thereto.

FIG. 17B is a cross-sectional view of semiconductor layers and the light shielding layers in a sensing region and a non-sensing region of a display panel according to another embodiment of the disclosure. The display panel 1701 in FIG. 17B is similar to the display panel 1700 in FIG. 17A, and the description of the embodiment of FIG. 17A may be referred to. In FIG. 17B, the light shielding layer 1731, the light shielding layer 1751 and the light shielding layer 1761 may be disposed on the same layer.

FIG. 17C is a cross-sectional view of semiconductor layers and the light shielding layers in a sensing region and a non-sensing region of a display panel according to another embodiment of the disclosure. The display panel 1703 in FIG. 17C is similar to the display panel 1700 in FIG. 17A, and the description of the embodiment of FIG. 17A may be referred to. In FIG. 17C, the light shielding layer 1751 and the light shielding layer 1761 may be disposed on the same layer, and the light shielding layer 1731 and the light shielding layer 1751 (or the light shielding layer 1761) may be disposed on different layers.

FIG. 17D is a cross-sectional view of semiconductor layers and the light shielding layers in a sensing region and a non-sensing region of a display panel according to another embodiment of the disclosure. The display panel 1704 in FIG. 17D is similar to the display panel 1703 in FIG. 17C, and the description of the embodiment of FIG. 17C may be referred to. In FIG. 17D, the light shielding layer 1770 and the light shielding layer 1731 may be disposed on different layers, and the light shielding layer 1770 is located under the semiconductor layer 1750 and the semiconductor layer 1760. Therefore, the light shielding layer 1770 with larger area may be used to increase the protection effect of the element.

FIG. 17E is a cross-sectional view of semiconductor layers and the light shielding layers in a sensing region and a non-sensing region of a display panel according to another embodiment of the disclosure. The display panel 1705 in FIG. 17E is similar to the display panel 1704 in FIG. 17D, and the description of the embodiment of FIG. 17D may be referred to. In FIG. 17E, the conductive layer 1732 may be used as a top gate of the semiconductor layer 1730. When the material of the light shielding layer 1731 is a conductive material (such as metal), the light shielding layer 1731 may be used as a bottom gate of the semiconductor 1730. In addition, the conductive line 1732 may be coupled to the light shielding layer 1731 through a connection element 1780. Furthermore, the conductive line 1752 may be used as a gate of the semiconductor layer 1750.

FIG. 17F is a cross-sectional view of semiconductor layers and the light shielding layers in a sensing region and a non-sensing region of a display panel according to another embodiment of the disclosure. The display panel 1706 in FIG. 17F is similar to the display panel 1705 in FIG. 17E, and the description of the embodiment of FIG. 17E may be referred to. In FIG. 17F, the conductive layer 1752 may be used as a top gate of the semiconductor layer 1750. When the material of the light shielding layer 1751 is a conductive material (such as metal), the light shielding layer 1751 may be used as a bottom gate of the semiconductor 1750. In addition, the conductive layer 1752 may also be coupled to the light shielding layer 1751 through the connection element 1780.

In the embodiments of FIG. 17A to FIG. 17F of the disclosure, the distance between the light shielding layers may be adjusted to increase the region of the display panel that is not shielded by the light shielding layer, so as to provide the sensing element (such as the infrared sensor, the camera, the light sensor, etc.) for use, but the disclosure is not limited thereto.

In summary, according to the display panel disclosed by the embodiments of the disclosure, the first conductive line and the second conductive line of the pixel circuit are adjacently disposed, the first conductive line and the second conductive line are disposed between the third conductive line and the fourth conductive line, the first conductive line, the second conductive line, the third conductive line, and the fourth conductive line extend along the same direction, and the first distance Y1 between the first conductive line and the second conductive line and the second distance Y2 between the third conductive line and the fourth conductive line conform to the following relationship: $0 \leq Y1/Y2 \leq 0.25$. In addition, the embodiment of the disclosure further discloses that the display panel has the sensing region and the non-sensing region adjacent to the sensing region, the sensing region and the non-sensing region are disposed on the substrate, the first conductive line and the second conductive line are disposed on the substrate and extending along the same direction, the second conductive line is disposed adjacent to the first conductive line, and the first distance between the first conductive line and the second conductive line on the sensing region is different from the second distance between the first conductive line and the second conductive line on the non-sensing region. Therefore, the distance between the conductive lines may be shortened, the pixel density may be increased, or some regions may be vacated to the sensing element (such as the infrared sensor, the camera, the light sensor, etc.) for use.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. A display panel, comprising:
   a substrate; and
   a pixel circuit, disposed on the substrate, wherein the pixel circuit is configured to drive a light-emitting unit and the pixel circuit comprises:
   a first conductive line and a second conductive line disposed adjacent the first conductive line; and
   a third conductive line and a fourth conductive line;
   wherein the first conductive line and the second conductive line are disposed between the third conductive line and the fourth conductive line;
   wherein the first conductive line, the second conductive line, the third conductive line and the fourth conductive line extend along a same direction;
   wherein a first distance Y1 between the first conductive line and the second conductive line and a second distance Y2 between the third conductive line and the fourth conductive line conform to the following relationship: $0 \leq Y1/Y2 \leq 0.25$; and
   wherein the third conductive line and the fourth conductive line are the same layer.

2. The display panel according to claim 1, wherein the pixel circuit comprises a first transistor coupled to the first conductive line and a second transistor coupled to the second conductive line, and the first transistor and the second transistor have different semiconductor materials.

3. The display panel according to claim 2, wherein the first conductive line receives a first signal, the second conductive line receives a second signal, and the second signal is different from the first signal.

4. The display panel according to claim 3, wherein the first signal and the second signal are control signals.

5. The display panel according to claim 3, wherein the first signal is a common signal, and the second signal is a control signal.

6. The display panel according to claim 2, wherein the different semiconductor materials comprise a silicon semiconductor and an oxide semiconductor.

7. The display panel according to claim 6, wherein the silicon semiconductor comprises an amorphous silicon semiconductor, a single crystalline silicon semiconductor or a poly-silicon semiconductor.

8. The display panel according to claim 6, wherein the oxide semiconductor comprises an indium gallium zinc oxide (IGZO) semiconductor.

9. The display panel according to claim 1, wherein the third conductive line and the fourth conductive line receive the same type of signals.

10. The display panel according to claim 1, wherein the first conductive line and the second conductive line at least partially overlap in a top view direction.

11. The display panel according to claim 1, wherein the first conductive line and the second conductive line are disposed on different layers.

12. The display panel according to claim 1, wherein the first conductive line and the second conductive line are made of different metal layers.

13. The display panel according to claim 1, wherein the third conductive line and the fourth conductive line are made of the same metal layer.

14. The display panel according to claim 1, wherein no conductive line is disposed between the first conductive line and the second conductive line.

15. The display panel according to claim 1, further comprising a fifth conductive line, wherein the fifth conductive line and the second conductive line at least overlap in a top view direction.

16. The display panel according to claim 15, wherein the fifth conductive line and the second conductive line are disposed on different layers.

17. A display panel, comprising:
   a substrate, having a sensing region and a non-sensing region adjacent to the sensing region; and a first conductive line, a second conductive line, a third conductive line, and a fourth conductive line, disposed on the substrate and extending along a same direction;

wherein the first conductive line and the second conductive line are disposed between the third conductive line and the fourth conductive line;

wherein the second conductive line is disposed adjacent to the first conductive line, and a first distance between the first conductive line and the second conductive line on the sensing region is different from a second distance between the first conductive line and the second conductive line on the non-sensing region; and wherein the third conductive line and the fourth conductive line are the same layer.

18. The display panel according to claim 17, wherein the first distance is greater than the second distance.

19. The display panel according to claim 17, wherein the first distance is less than the second distance.

* * * * *